(12) United States Patent
Negoro et al.

(10) Patent No.: US 11,956,570 B2
(45) Date of Patent: Apr. 9, 2024

(54) IMAGING SYSTEM AND ELECTRONIC DEVICE

(71) Applicant: SEMICONDUCTOR ENERGY LABORATORY CO., LTD., Atsugi (JP)

(72) Inventors: Yusuke Negoro, Osaka (JP); Seiichi Yoneda, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 200 days.

(21) Appl. No.: 17/640,134

(22) PCT Filed: Sep. 7, 2020

(86) PCT No.: PCT/IB2020/058298
§ 371 (c)(1),
(2) Date: Mar. 3, 2022

(87) PCT Pub. No.: WO2021/053449
PCT Pub. Date: Mar. 25, 2021

(65) Prior Publication Data
US 2022/0303494 A1    Sep. 22, 2022

(30) Foreign Application Priority Data

Sep. 20, 2019   (JP) ................................ 2019-171050

(51) Int. Cl.
*H04N 7/01* (2006.01)
*H01L 27/146* (2006.01)
(Continued)

(52) U.S. Cl.
CPC ..... *H04N 7/0135* (2013.01); *H01L 27/14616* (2013.01); *H04N 23/951* (2023.01); *H10K 39/32* (2023.02); *H01L 27/14643* (2013.01)

(58) Field of Classification Search
CPC ............. H01L 27/14643; H01L 27/307; H01L 27/14616; H04N 5/23232; H04N 7/0135; H04N 5/23229; H04N 9/09; G06T 5/50
(Continued)

(56) References Cited

U.S. PATENT DOCUMENTS

| 8,378,391 B2 | 2/2013 | Koyama et al. |
| 8,916,869 B2 | 12/2014 | Koyama et al. |

(Continued)

FOREIGN PATENT DOCUMENTS

| CN | 110651468 A | 1/2020 |
| CN | 110832845 A | 2/2020 |

(Continued)

OTHER PUBLICATIONS

Dong.C et al., "Image Super-Resolution Using Deep Convolutional Networks", arXiv:1501.00092v3, Jul. 31, 2015, pp. 1-14, Cornell University.

(Continued)

*Primary Examiner* — Xi Wang
(74) *Attorney, Agent, or Firm* — NIXON PEABODY LLP; Jeffrey L. Costellia

(57) ABSTRACT

An imaging system that has an image processing function and is capable of generating an interpolation image is provided. The imaging system has an additional function such as image processing and can generate an interpolation image by using image data output from an imaging device. The imaging device can perform filter processing in parallel during a light exposure period, and thus can perform a large amount of arithmetic operation and generate a high-quality interpolation image. The number of arithmetic operations can be further increased particularly during image capturing in a dark place, which requires a long exposure time.

(Continued)

Accordingly, the frame rate can be substantially increased, and high-quality moving image data can be generated.

10 Claims, 25 Drawing Sheets

(51) Int. Cl.
*H04N 23/951* (2023.01)
*H10K 39/32* (2023.01)

(58) Field of Classification Search
USPC .......................................................... 382/167
See application file for complete search history.

(56) References Cited

U.S. PATENT DOCUMENTS

| | | | |
|---|---|---|---|
| 9,331,112 | B2 | 5/2016 | Koyama et al. |
| 9,773,814 | B2 | 9/2017 | Koyama et al. |
| 9,773,832 | B2 | 9/2017 | Kurokawa |
| 10,074,687 | B2 | 9/2018 | Kurokawa |
| 10,600,839 | B2 | 3/2020 | Kurokawa |
| 10,951,850 | B2 | 3/2021 | Yamamoto et al. |
| 10,964,743 | B2 | 3/2021 | Kurokawa |
| 11,101,302 | B2 | 8/2021 | Ikeda et al. |
| 2009/0252411 | A1* | 10/2009 | Siddiqui ............... G06T 3/4015 |
| | | | 382/167 |
| 2016/0172410 | A1 | 6/2016 | Kurokawa |
| 2017/0180681 | A1* | 6/2017 | Okita ................... H04N 25/134 |
| 2021/0151486 | A1 | 5/2021 | Kobayashi et al. |
| 2021/0233952 | A1 | 7/2021 | Kurokawa |
| 2021/0384239 | A1 | 12/2021 | Ikeda et al. |

FOREIGN PATENT DOCUMENTS

| | | |
|---|---|---|
| EP | 3654635 A | 5/2020 |
| JP | 2011-119711 A | 6/2011 |
| JP | 2016-123087 A | 7/2016 |
| KR | 2020-0012917 A | 2/2020 |
| KR | 2020-0028967 A | 3/2020 |
| WO | WO-2018/215882 | 11/2018 |
| WO | WO-2019/012369 | 1/2019 |

OTHER PUBLICATIONS

International Search Report (Application No. PCT/IB2020/058298) dated Dec. 8, 2020.
Written Opinion (Application No. PCT/IB2020/058298) dated Dec. 8, 2020.

* cited by examiner $a = x_1 w_1 + x_2 w_2 + b$

FIG. 24A1
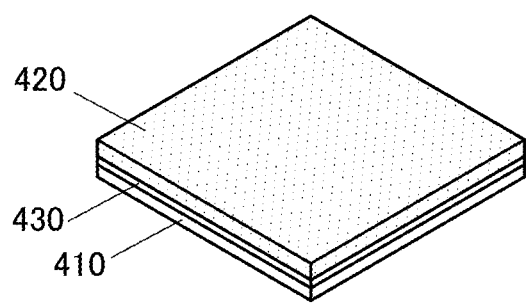
FIG. 24B1
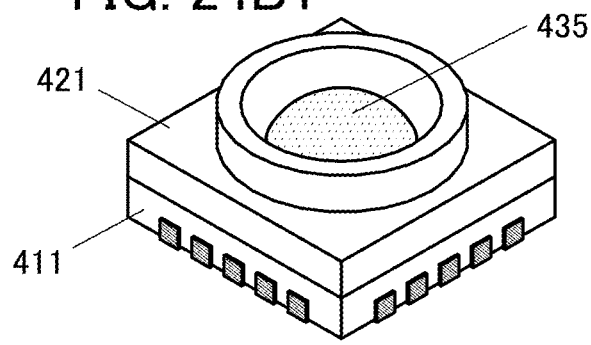
FIG. 24A2
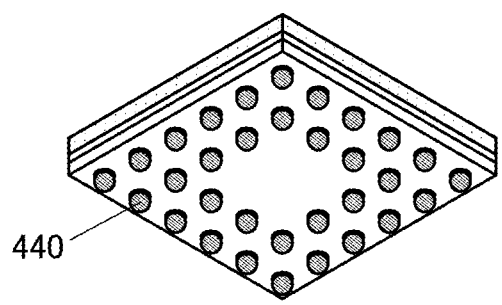
FIG. 24B2
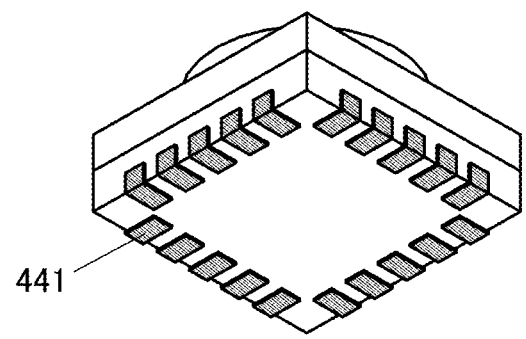
FIG. 24A3
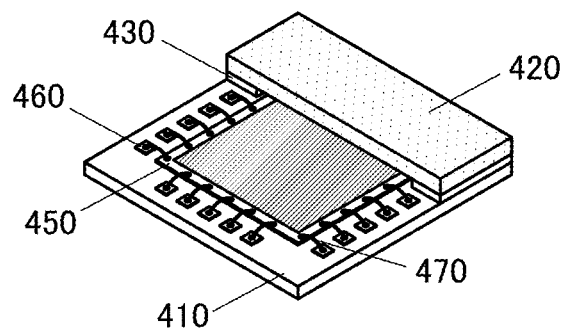
FIG. 24B3
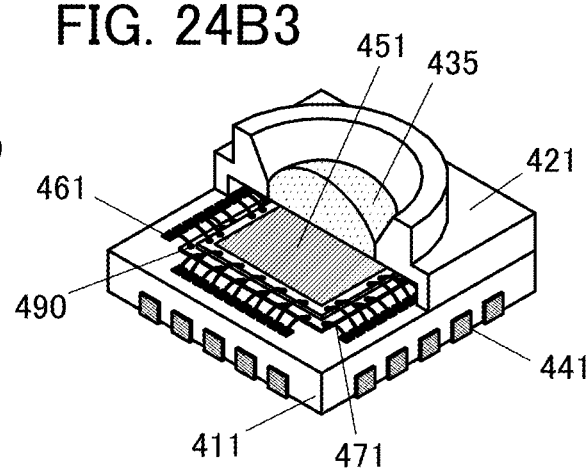

IMAGING SYSTEM AND ELECTRONIC DEVICE

TECHNICAL FIELD

One embodiment of the present invention relates to an imaging system.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device means every device that can function by utilizing semiconductor characteristics. A transistor and a semiconductor circuit are embodiments of semiconductor devices. In some cases, a memory device, a display device, an imaging device, and an electronic device and a system including any of these devices include a semiconductor device.

BACKGROUND ART

A technique for forming a transistor by using an oxide semiconductor thin film formed over a substrate has attracted attention. For example, an imaging device with a structure in which a transistor that includes an oxide semiconductor and has an extremely low off-state current is used in a pixel circuit is disclosed in Patent Document 1.

A technique for adding an arithmetic operation function to an imaging device is disclosed in Patent Document 2.

REFERENCE

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

An imaging device provided with a solid-state imaging element such as a CMOS image sensor can easily capture high-quality images. In the next generation, an imaging device is required to be equipped with more intelligent functions.

Image data (analog data) obtained by an imaging device is converted into digital data, and then subjected to image processing as necessary after being extracted to the outside. If the processing can be carried out in the imaging device, higher-speed communication with an external device is achieved, improving user's convenience. Furthermore, load and power consumption of a peripheral device or the like can be reduced. Moreover, if complicated data processing is performed using analog data not converted, time required for data conversion can be shortened.

To express smooth motion in moving images, increasing the frame rate is preferable. Meanwhile, the frame rate cannot be increased unconditionally because a larger number of pixels makes it more difficult to ensure a horizontal period. Therefore, a technique for generating an image for interpolating a frame between actual images (an interpolation image) is sometimes used. However, in the case where the frame rate for obtaining actual images is rather high, it is likely to be difficult to ensure a time for generating an interpolation image.

In view of the above, an object of one embodiment of the present invention is to provide an imaging system capable of image processing. Another object is to provide an imaging system capable of generating an interpolation image. Another object is to provide an imaging system with low power consumption. Another object is to provide an imaging system with high reliability. Another object is to provide a novel imaging device, imaging system, or the like. Another object is to provide a method for driving the above imaging device or imaging system. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging system that has an image processing function and is capable of generating an interpolation image.

One embodiment of the present invention is an imaging system including an imaging device, a first semiconductor device, a second semiconductor device, and a third semiconductor device. The imaging device has a function of obtaining first data and second data in each frame period. The imaging device has a function of generating third data by filter processing of the first data, and a function of generating fourth data by filter processing of the second data. The first semiconductor device has a function of generating fifth data by arithmetic operation using third data and fourth data that are obtained in an n-th frame (n is a natural number). The first semiconductor device has a function of generating sixth data by arithmetic operation using third data and fourth data that are obtained in an (n+1)th frame. The second semiconductor device has a function of generating an interpolation image by using the fifth data and the sixth data. The third semiconductor device has a function of generating moving image data including first data obtained in the n-th frame, the interpolation image, and first data obtained in the (n+1)th frame in this order.

The third data can be generated while the second data is obtained.

Another embodiment of the present invention is an imaging system including an imaging device, a first semiconductor device, a second semiconductor device, and a third semiconductor device. The imaging device has a function of obtaining first data and second data. The first image is obtained in each frame period. The imaging device has a function of generating third data by filter processing of the first data, and a function of generating fourth data by filter processing of the second data. The first semiconductor device has a function of generating fifth data by arithmetic operation using third data and fourth data that are obtained in an n-th frame (n is a natural number). The first semiconductor device has a function of generating sixth data by arithmetic operation using third data and fourth data that are obtained in an (n+1)th frame. The second semiconductor device has a function of generating an interpolation image by using the fifth data and the sixth data. The third semiconductor device has a function of generating moving image data including first data obtained in the n-th frame, the interpolation image, and first data obtained in the (n+1)th frame in this order.

Filter processing of the first data obtained in the n-th frame can be performed in the (n+1)th frame.

The imaging device includes a pixel block, a first circuit, and a second circuit. The pixel block can include a plurality of pixels. The first circuit can have a function of supplying a first potential or a second potential to each of the pixels. Each of the pixels can have a function of obtaining the first data. Each of the pixels can have a function of generating the second data by adding the first potential to the first data. Each of the pixels can have a function of generating the third data by adding the second potential to the first data. The second circuit can have a function of generating the fourth data corresponding to a difference between the sum of the second data output from the plurality of pixels and the sum of the third data output from the plurality of pixels.

Each of the pixels includes a first transistor, a second transistor, a third transistor, a fourth transistor, a fifth transistor, a sixth transistor, a photoelectric conversion device, and a capacitor. One electrode of the photoelectric conversion device can be electrically connected to one of a source and a drain of the first transistor and one of a source and a drain of the second transistor. The other of the source and the drain of the first transistor can be electrically connected to one of a source and a drain of the third transistor, a gate of the fourth transistor, and one electrode of the capacitor. One of a source and a drain of the fourth transistor can be electrically connected to one of a source and a drain of the fifth transistor. The other electrode of the capacitor can be electrically connected to one of a source and a drain of the sixth transistor.

The first circuit can be electrically connected to the other of the source and the drain of the sixth transistor.

The second circuit can have a function of a correlated double sampling circuit. The second circuit can be electrically connected to the other of the source and the drain of the fifth transistor.

It is preferred that at least one of the first transistor to the sixth transistor include a metal oxide in a channel formation region, and that the metal oxide contain In, Zn, and M (M is one or more of Al, Ti, Ga, Ge, Sn, Y, Zr, La, Ce, Nd, and Hf).

Effect of the Invention

With one embodiment of the present invention, an imaging system capable of image processing can be provided. An imaging system capable of generating an interpolation image can be provided. An imaging system with low power consumption can be provided. An imaging system with high reliability can be provided. A novel imaging device, imaging system, or the like can be provided. A method for driving the above imaging device or imaging system can be provided. A novel semiconductor device or the like can be provided.

BRIEF DESCRIPTION OF THE DRAWINGS

FIG. 24A1 to FIG. 24A3 and FIG. 24B1 to FIG. 24B3 are perspective views of a package and a module in each of which an imaging device is placed.

MODE FOR CARRYING OUT THE INVENTION

Figure 1:
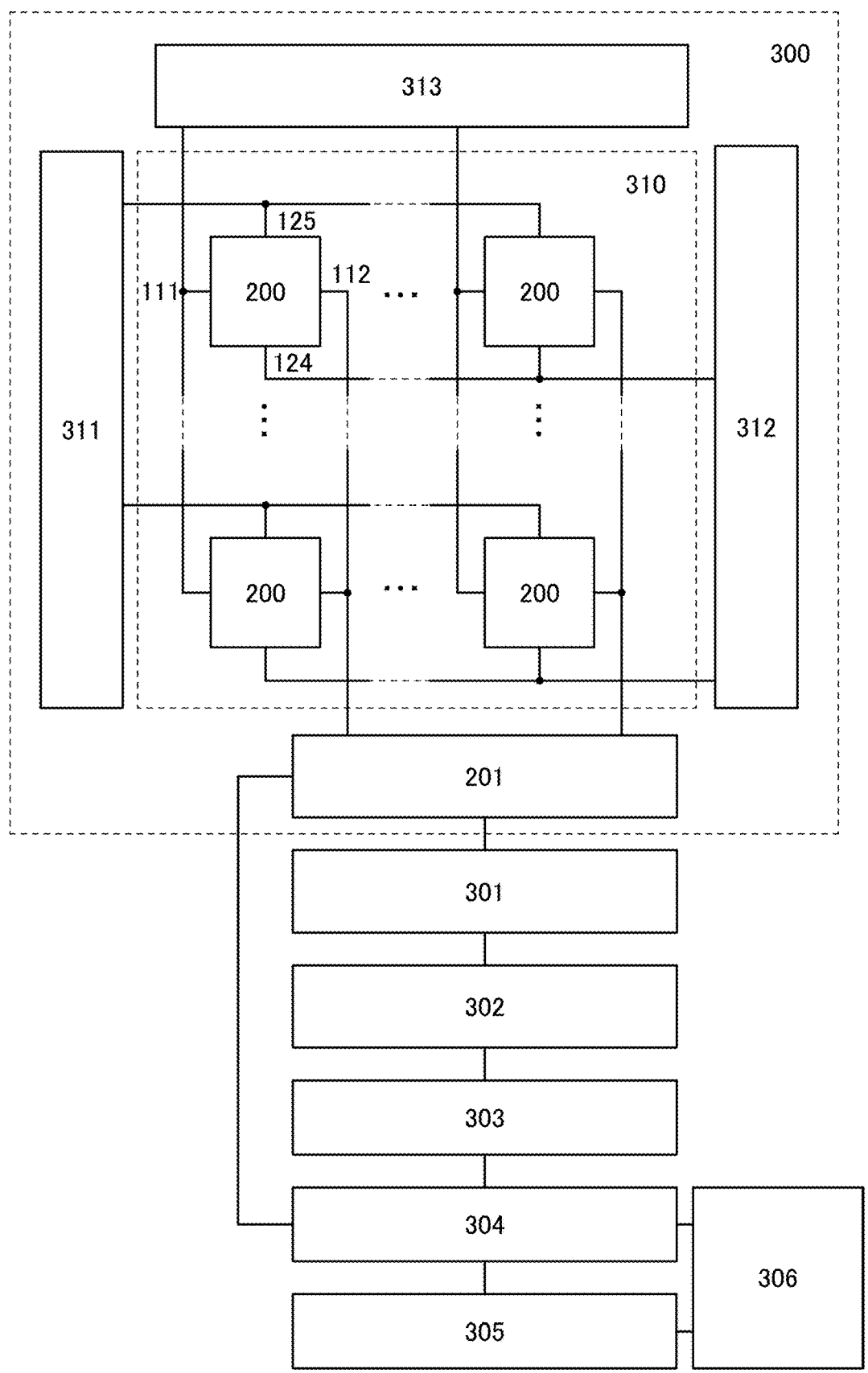
FIG. 1 is a block diagram illustrate an imaging system.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of the embodiments below. Note that in structures of the invention described below, the same portions or portions having similar functions are denoted by the same reference numerals in different drawings, and the description thereof is not repeated in some cases. In some case, the same components are denoted by different hatching patterns in different drawings, or the hatching patterns are omitted.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one conductor or a plurality of conductors. In this specification, even such a configuration is included in the category of direct connection.

Embodiment 1

In this embodiment, an imaging system that is one embodiment of the present invention will be described with reference to drawings.

One embodiment of the present invention is an imaging system including an imaging device that has an additional function such as image processing. The imaging device can retain analog data (image data) obtained by an imaging operation in a pixel and extract data obtained by multiplying the analog data by a given weight coefficient.

When the data is taken in a neural network or the like, processing such as image recognition can be performed. Since enormous volumes of image data in the state of analog data can be retained in pixels, processing can be performed efficiently.

The imaging system of one embodiment of the present invention can generate an interpolation image by using image data output from the imaging device. The imaging device can perform filter processing in parallel during a light exposure period, and thus can perform a large amount of arithmetic operation and generate a high-quality interpolation image. The number of arithmetic operations can be further increased particularly during image capturing in a dark place, which requires a long exposure time. Accordingly, the frame rate can be substantially increased, and high-quality moving image data can be generated.

<Imaging System>

FIG. 1 is a block diagram illustrating an imaging system of one embodiment of the present invention. The imaging system includes an imaging device 300 and a plurality of semiconductor devices. The imaging device 300 includes a pixel array 310, a circuit 311, a circuit 312, a circuit 313, and a circuit 201. The imaging system includes a circuit 301, a circuit 302, a circuit 303, a circuit 304, and a circuit 305 as the semiconductor devices. The imaging system may also include a display device 306.

Although the imaging device 300 has the above-described structure in this embodiment, the imaging device 300 may include one or more of the above semiconductor devices. The number of semiconductor devices is not limited to the above. For example, a semiconductor device in which some of the above semiconductor devices are integrated may be used. One or more of the functions of the above semiconductor devices may be replaced with an operation by software. A semiconductor device other than the above may be provided.

The pixel array 310 has an imaging function and an arithmetic operation function. The circuits 311 and 312 each have a selection function. The circuit 313 has a function of supplying a potential for product-sum operation to pixels and a selection function. The circuits 201 and 301 each have an arithmetic operation function. The circuit 302 has an arithmetic operation function or a data conversion function. The circuit 303 has a function of generating images. The circuit 304 has a function of integrating a plurality of pieces of image data. The circuit 305 has a function of storing image data. The display device 306 can display image data output from the circuit 304 or the circuit 305. As the circuit having a selection function, a shift register, a decoder, or the like can be used.

Figure 2:
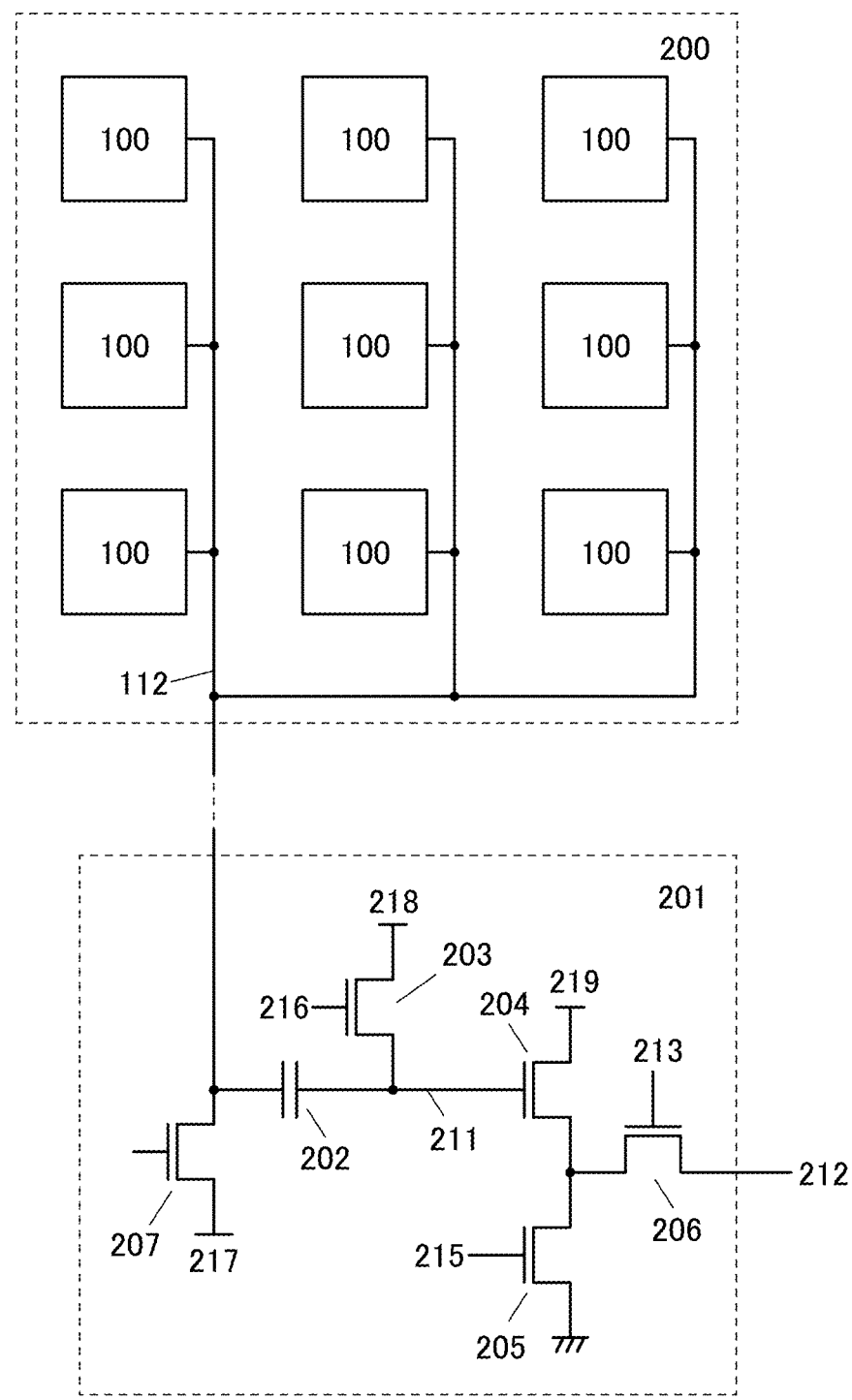
FIG. 2 is a diagram illustrating a pixel block and a circuit 201.

The pixel array 310 includes a plurality of pixel blocks 200. As illustrated in FIG. 2, the pixel block 200 includes a plurality of pixels 100 arranged in a matrix, and each of the pixels 100 is electrically connected to the circuit 201 through a wiring 112. Note that the circuit 201 can alternatively be provided in the pixel block 200.

The pixels 100 can obtain image data and generate data obtained by adding the image data and a weight coefficient. Note that the number of pixels included in the pixel block 200 is 3×3 in an example illustrated in FIG. 2 but is not limited to this. For example, the number of pixels can be 2×2, 4×4, or the like. Alternatively, the number of pixels in the horizontal direction and the number of pixels in the vertical direction may differ from each other. Furthermore, some pixels may be shared by adjacent pixel blocks.

The pixel block 200 and the circuit 201 can operate as a product-sum operation circuit.

<Pixel Circuit>

Figure 3A:
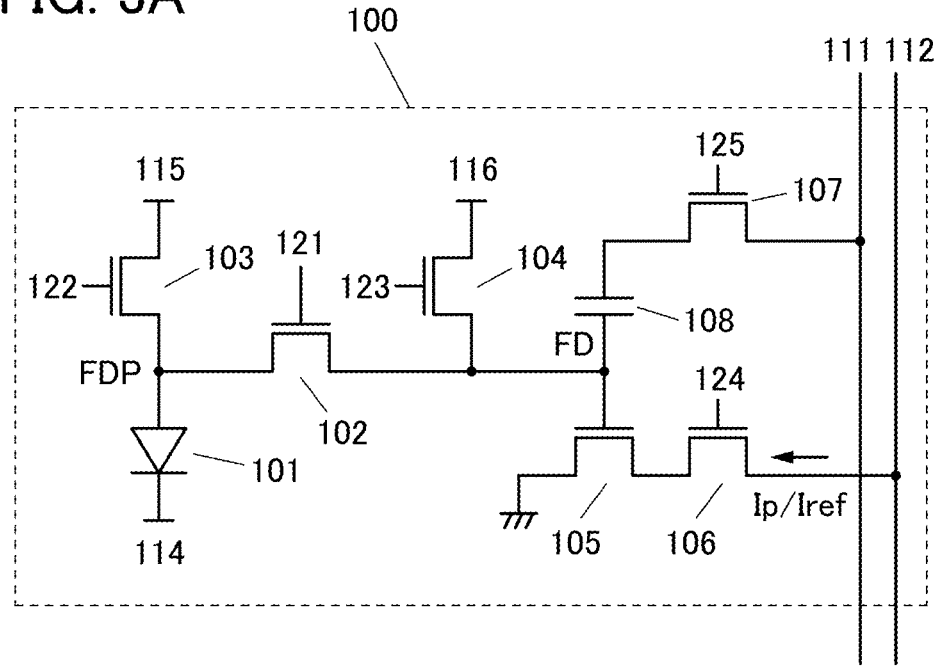
FIG. 3A and FIG. 3B are diagrams each illustrating a pixel 100.

As illustrated in FIG. 3A, the pixel 100 can include a photoelectric conversion device 101, a transistor 102, a transistor 103, a transistor 104, a transistor 105, a transistor 106, a transistor 107, and a capacitor 108.

One electrode of the photoelectric conversion device 101 is electrically connected to one of a source and a drain of the transistor 102 and one of a source and a drain of the transistor 103. The other of the source and the drain of the transistor 102 is electrically connected to one of a source and a drain of the transistor 104, a gate of the transistor 105, and one electrode of the capacitor 108. One of a source and a drain of the transistor 105 is electrically connected to one of a source and a drain of the transistor 106. The other electrode of the capacitor 108 is electrically connected to one of a source and a drain of the transistor 107.

The other electrode of the photoelectric conversion device 101 is electrically connected to a wiring 114. The other of the source and the drain of the transistor 103 is electrically connected to a wiring 115. The other of the source and the drain of the transistor 104 is electrically connected to a wiring 116. The other of the source and the drain of the transistor 106 is electrically connected to the wiring 112. The other of the source and the drain of the transistor 105 is electrically connected to a GND wiring or the like. The other of the source and the drain of the transistor 107 is electrically connected to a wiring 111.

A gate of the transistor 102 is electrically connected to a wiring 121. A gate of the transistor 103 is electrically connected to a wiring 122. A gate of the transistor 104 is electrically connected to a wiring 123. A gate of the transistor 106 is electrically connected to a wiring 124. A gate of the transistor 107 is electrically connected to a wiring 125.

Here, a point where the one electrode of the photoelectric conversion device 101, the one of the source and the drain of the transistor 102, and the one of the source and the drain of the transistor 103 are electrically connected to each other is referred to as a node FDP. Moreover, a point where the other of the source and the drain of the transistor 102, the one of the source and the drain of the transistor 104, the one electrode of the capacitor 108, and the gate of the transistor 105 are electrically connected to each other is referred to as a node FD.

The wirings 114, 115, and 116 can each have a function of a power supply line. For example, the wiring 114 can function as a high potential power supply line, and the wirings 115 and 116 can function as low potential power supply lines. Note that the wiring 115 and the wiring 116 may be electrically connected to each other. The wirings 121, 122, 123, 124, and 125 can function as signal lines that control the conduction of the respective transistors. The wiring 111 can function as a wiring for supplying a potential corresponding to a weight coefficient to the pixel 100. The wiring 112 can function as a wiring that electrically connects the pixel 100 and the circuit 201.

Note that an amplifier circuit or a gain control circuit may be electrically connected to the wiring 112.

As the photoelectric conversion device 101, a photodiode can be used. There is no limitation on types of photodiodes, and it is possible to use a Si photodiode in which a photoelectric conversion layer contains silicon, an organic photodiode in which a photoelectric conversion layer includes an organic photoconductive film, or the like. In order to increase the light detection sensitivity under low illuminance conditions, an avalanche photodiode is preferably used.

The transistor 102 can have a function of controlling the potential of the node FD. The transistor 103 can have a function of initializing the potential of the node FDP. The transistor 104 can have a function of initializing the potential of the node FD. The transistor 105 can have a function of controlling a current fed by the circuit 201 in accordance with the potential of the node FD. The transistor 106 can have a function of selecting a pixel. The transistor 107 can have a function of supplying a potential corresponding to a weight coefficient to the other electrode of the capacitor 108.

Figure 3B:
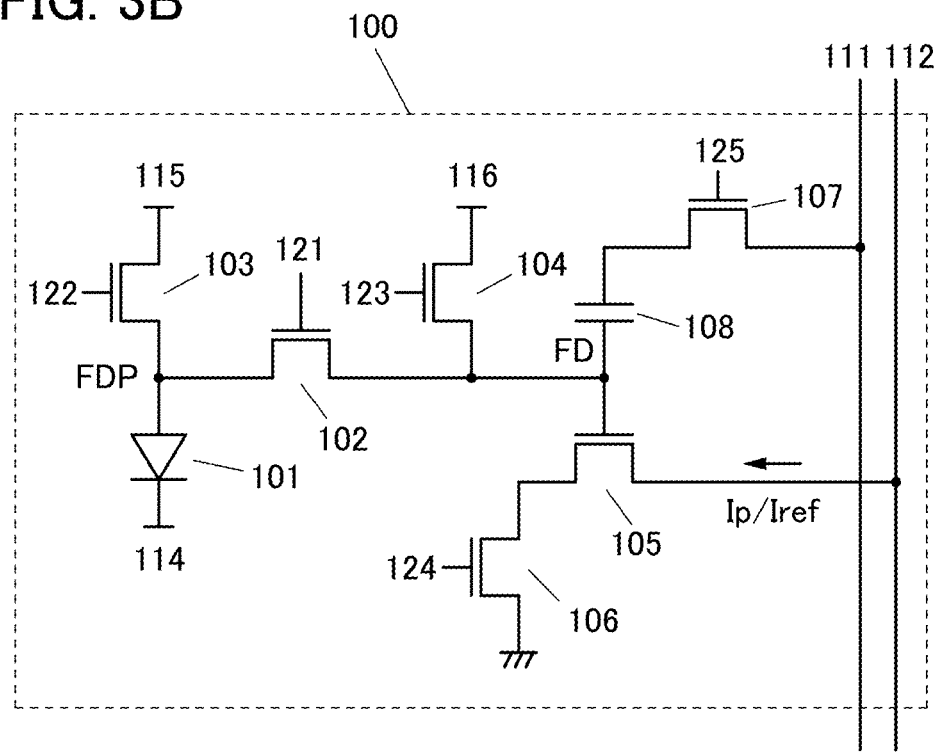

Note that as illustrated in FIG. 3B, the one of the source and the drain of the transistor 105 may be electrically connected to the one of the source and the drain of the transistor 106, the other of the source and the drain of the transistor 105 may be electrically connected to the wiring 112, and the other of the source and the drain of the transistor 106 may be electrically connected to a GND wiring or the like.

Figure 4A:
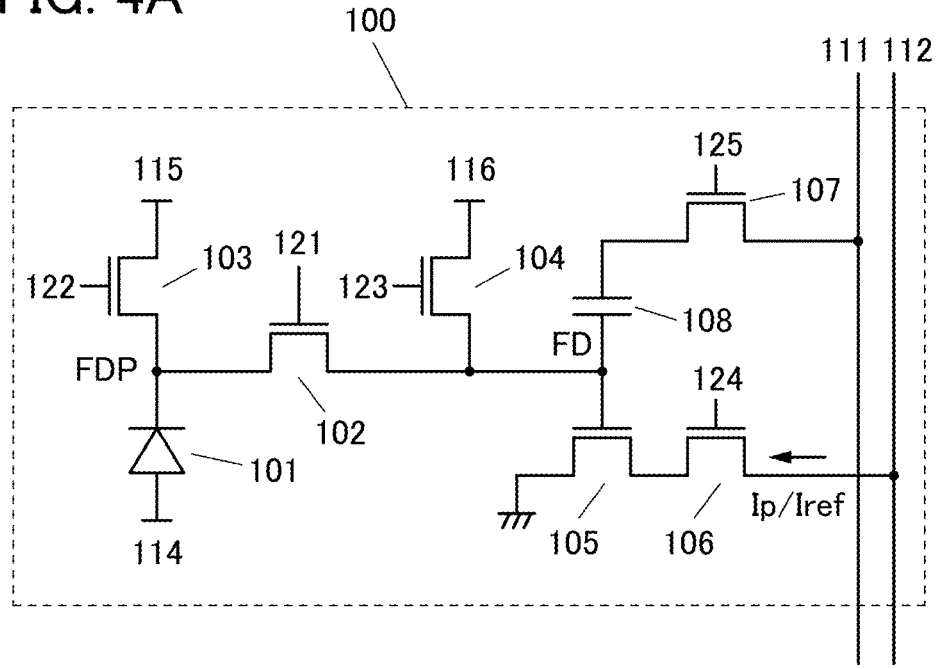
FIG. 4A and FIG. 4B are diagrams each illustrating the pixel 100.
Figure 4B:
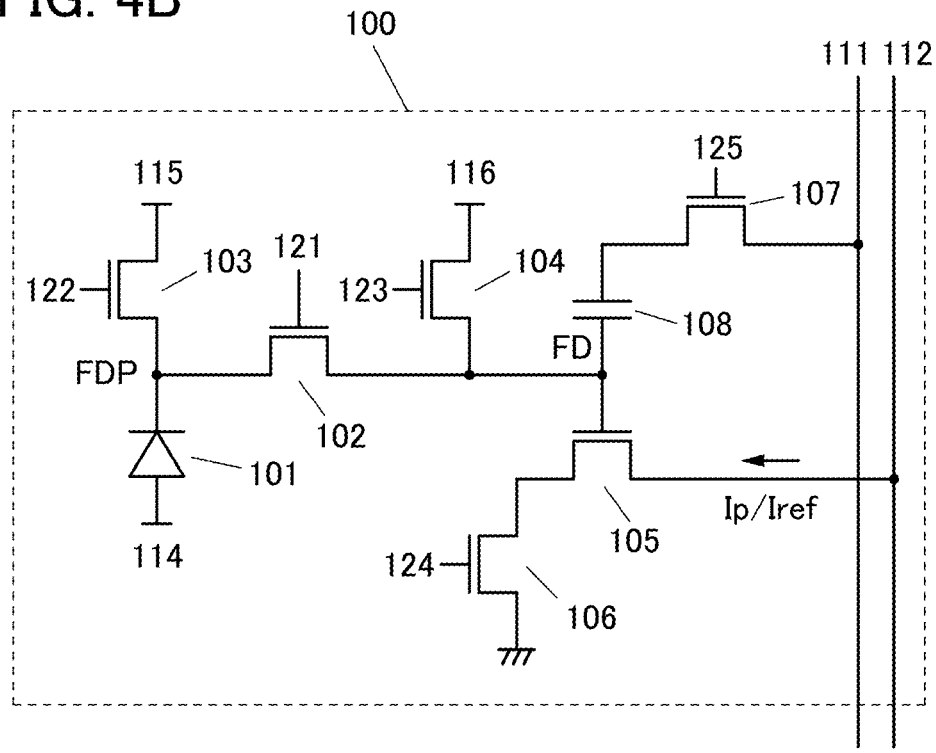

As illustrated in FIG. 4A and FIG. 4B, the connection direction of the photoelectric conversion device 101 may be reversed. In this case, the wiring 114 functions as a low potential power supply line, and the wirings 115 and 116 function as high potential power supply lines.

In the case where an avalanche photodiode is used as the photoelectric conversion device 101, a high voltage is sometimes applied and thus a transistor with a high withstand voltage is preferably used as a transistor connected to the photoelectric conversion device 101. As the transistor with a high withstand voltage, a transistor using a metal oxide in its channel formation region (hereinafter an OS transistor) or the like can be used, for example. Specifically, OS transistors are preferably used as the transistors 102, 103, and 104.

An OS transistor also has a feature of an extremely low off-state current. When OS transistors are used as the transistors 102, 103, 104, and 107, the charge retention period at the node FD and the node FDP can be prolonged greatly. Therefore, a global shutter mode in which a charge accumulation operation is performed in all the pixels at the same time can be used without complicating the circuit configuration and the operation method. Furthermore, while image data is retained at the node FD, arithmetic operation using the image data can be performed a plurality of times.

Meanwhile, it is sometimes desired that the transistor 105 have excellent amplifying properties. In addition, it is sometimes preferred that a high-mobility transistor capable of high-speed operation be used as the transistor 107. Accordingly, transistors using silicon in their channel formation regions (hereinafter Si transistors) may be used as the transistors 105 and 107.

Note that without limitation to the above, an OS transistor and a Si transistor may be freely used in combination. Alternatively, all the transistors may be OS transistors. Alternatively, all the transistors may be Si transistors. Examples of Si transistors include a transistor including amorphous silicon and a transistor including crystalline silicon (microcrystalline silicon, low-temperature polysilicon, or single crystal silicon).

The potential of the node FD in the pixel 100 is determined by a potential obtained by adding a reset potential supplied from the wiring 116 and a potential (image data) generated by photoelectric conversion by the photoelectric conversion device 101. Alternatively, the potential of the node FD is determined by capacitive coupling between the above potential and a potential corresponding to a weight coefficient supplied from the wiring 111. Consequently, a current corresponding to data in which a given weight coefficient is added to the image data can be made flow through the transistor 105.

In the pixel 100, transistors for resetting the potentials of the node FD and the node FDP are provided separately. Therefore, a light exposure operation (accumulation operation) and a reading operation can be performed concurrently. Although the detailed operation will be described later, the following operation can be performed, for example. After a light exposure operation, the charge at the node FDP is transferred to the node FD. Then, the node FDP is reset, and the next light exposure operation starts. In the period of this light exposure operation, the charge at the node FD is read out, and the node FD is reset after the reading ends. Performing this operation continuously can ensure an adequately long light exposure time and makes it easier to increase the frame frequency.

Note that the above is an example of a circuit configuration of the pixel 100 described in this embodiment, and a circuit configuration related to photoelectric conversion may be a different circuit configuration.

<Circuit 201>

As illustrated in FIG. 2, the pixels 100 are electrically connected to each other through the wiring 112. The circuit 201 can perform arithmetic operation using the sum of currents flowing through the transistors 105 of the pixels 100.

The circuit 201 includes a capacitor 202, a transistor 203, a transistor 204, a transistor 205, a transistor 206, and a transistor 207 as a voltage converter circuit.

One electrode of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One of a source and a drain of the transistor 207 is electrically connected to the other electrode of the capacitor 202.

The other electrode of the capacitor 202 is electrically connected to the wiring 112. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other of the source and the drain of the transistor 207 is electrically connected to a wiring 217. A gate of the transistor 203 is electrically connected to a wiring 216. A gate of the transistor 205 is electrically connected to a wiring 215. A gate of the transistor 206 is electrically connected to a wiring 213.

The wirings 217, 218, and 219 can each have a function of a power supply line. For example, the wiring 218 can have a function of a wiring that supplies a potential specifically for reading. The wirings 217 and 219 can function as high potential power supply lines. The wirings 213, 215, and 216 can function as signal lines for controlling the conduction of the respective transistors. The wiring 212 is an output line and can be electrically connected to the circuit 301 illustrated in FIG. 1, for example.

The transistor 203 can have a function of resetting the potential of the wiring 211 to the potential of the wiring 218. The transistors 204 and 205 can have a function of a source follower circuit. The transistor 206 can have a function of controlling a reading operation. The circuit 201 has a function of a correlated double sampling circuit (CDS circuit) and can be replaced with a circuit having the function and another configuration. The wiring 211 is a wiring that electrically connects the one electrode of the capacitor 202, the one of the source and the drain of the transistor 203, and the gate of the transistor 204.

In one embodiment of the present invention, offset components other than the product of image data (X) and a weight coefficient (W) are eliminated, and an objective WX is extracted. WX can be calculated using data obtained from the same pixel when light exposure is performed (imaging is performed) and when light exposure is not performed (imaging is not performed), and data obtained by adding the weight to these data.

The total amount of currents ($I_p$) flowing through the pixels 100 when light exposure is performed is $k\Sigma(X-V_{th})^2$, and the total amount of currents ($I_p$) flowing through the pixels 100 when the weight is added is $k\Sigma(W+X-V_{th})^2$. The total amount of currents ($I_{ref}$) flowing through the pixels 100 when light exposure is not performed is $k\Sigma(0-V_{th})^2$, and the total amount of currents ($I_{ref}$) flowing through the pixels 100 when the weight is added is $k\Sigma(W-V_{th})^2$. Here, k is a constant and $V_{th}$ is the threshold voltage of the transistor 105.

First, a difference (data A) between the data obtained when light exposure is performed and the data obtained by adding the weight to the data is calculated. The difference is $k\Sigma((X-V_{th})^2-(W+X-V_{th})^2)=k\Sigma(-W^2-2W\cdot X+2W\cdot V_{th})$.

Next, a difference (data B) between the data obtained when light exposure is not performed and the data obtained by adding the weight to the data is calculated. The difference is $k\Sigma((0-V_{th})^2-(W-V_{th})^2)=k\Sigma(-W^2+2W\cdot V_{th})$.

Then, a difference between the data A and the data B is calculated. The difference is $k\Sigma(-W^2-2W\cdot X+2W\cdot V_{th}-(-W^2+2W\cdot V_{th}))=k\Sigma(-2W\cdot X)$. That is, offset components other than the product of the image data (X) and the weight coefficient (W) can be eliminated.

The circuit 201 can read out the data A and the data B. Note that the calculation of the difference between the data A and the data B can be performed by the circuit 301, for example.

<Operation of Imaging System>

Figure 5:
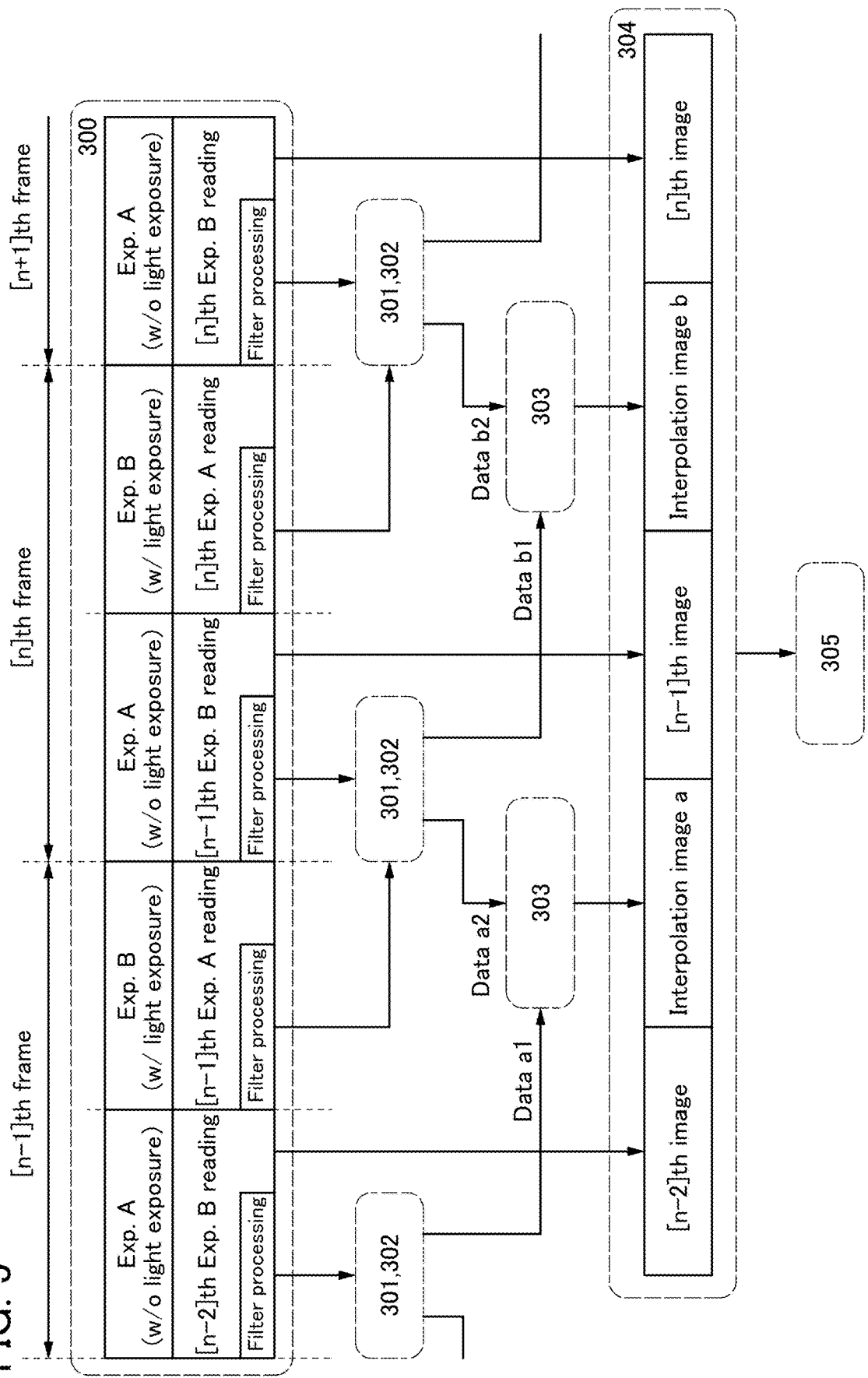
FIG. 5 is a diagram illustrating an imaging system.

FIG. 5 is a diagram illustrating an operation of generating moving image data with the use of the imaging system of one embodiment of the present invention. As described above, WX can be calculated using data obtained from the same pixel when light exposure is performed ("with light exposure") and when light exposure is not performed ("without light exposure"). Thus, data with light exposure and data without light exposure are obtained in one frame period. In FIG. 5, a light exposure operation corresponding to "without light exposure" is denoted as Exp. A, and a light exposure operation corresponding to "with light exposure" is denoted as Exp. B.

In the pixel 100, the light exposure operation and the reading operation can be performed concurrently. Hence, as illustrated in FIG. 5, data obtained in the Exp. A operation can be read out during the next Exp. B operation. Data obtained in the Exp. B operation can be read out during the next Exp. A operation.

In the reading operation, an operation of adding a weight to the data obtained from the pixel and reading out the resulting data, and an operation of reading out the data without adding a weight are conducted. The former operation corresponds to filter processing and can be performed using a convolutional filter of a convolutional neural network (CNN), for example. As the filter processing, a plurality of filter operations are preferably performed. The operation thus far can be conducted in the imaging device 300.

The data that undergoes the filter operation and is output from the imaging device 300 is input to a semiconductor device including the circuits 301 and 302, and is subjected to processing such as differential operation, filter operation, and pooling. A plurality of circuits 301, 302, and 303 are shown in FIG. 5 to clarify the data flow; however, in reality, one circuit 301, one circuit 302, and one circuit 303 can each perform a plurality of kinds of processing.

Then, a plurality of pieces of data are output from the semiconductor device including the circuits 301 and 302 and input to a semiconductor device including the circuit 303. The circuit 303 can generate an interpolation image by using the input data. Note that an interpolation image is an image corresponding to an image between a given frame image and the next frame image, and smooth motion can be expressed in moving images including an interpolation image. This can also be regarded as increasing the frame frequency.

For example, as illustrated in FIG. 5, an interpolation image a can be generated using data a1 generated based on data obtained in an (n−2)th frame and data a2 generated based on data obtained in an (n−1)th frame. Similarly, an interpolation image b can be generated using data b1 generated based on data obtained in the (n−1)th frame and data b2 generated based on data obtained in an n-th frame. Note that the above is an example where one interpolation image is generated between two frame images that are actually obtained; alternatively, two or more interpolation images may be generated.

Data that does not undergo the filter operation and is read out in a normal manner and the interpolation image generated in the circuit 303 are input to a semiconductor device including the circuit 304. The circuit 304 can generate new moving image data in which these data are connected. The moving image data is input to and stored in the circuit 305, which is a memory device. Alternatively, the moving image data may be input to the display device 306 illustrated in FIG. 1 and display may be performed.

<Imaging Operation>

Figure 6:
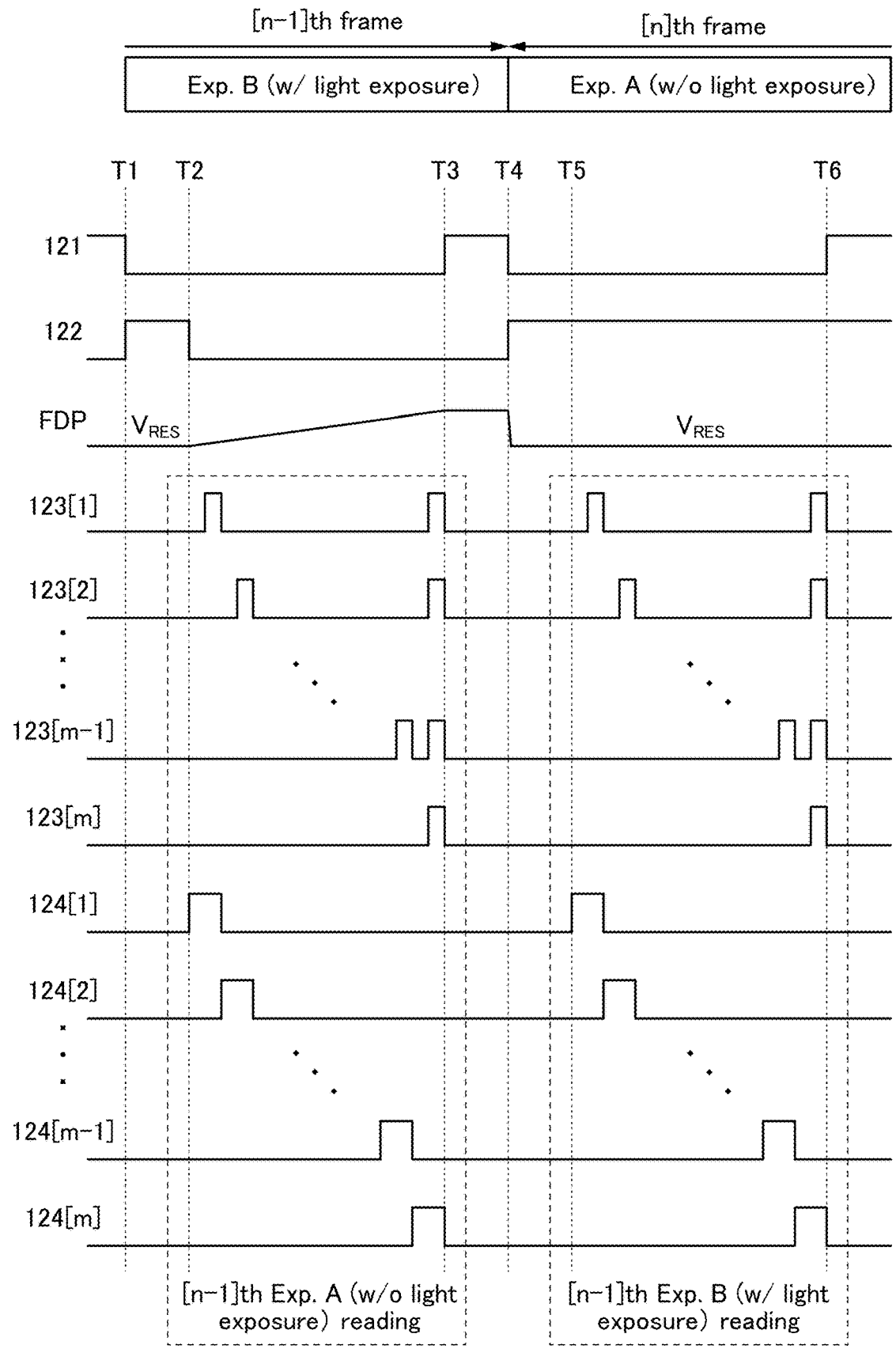
FIG. 6 is a timing chart showing the operation of an imaging device.

Next, the Exp. B (w/light exposure) operation in the (n−1)th frame and the Exp. A (w/o light exposure) operation in the n-th frame shown in FIG. 5 will be specifically described with reference to a timing chart in FIG. 6. Note that the pixel 100 described here has the configuration illustrated in FIG. 3A or FIG. 3B. Furthermore, a predetermined constant potential is supplied to the power supply lines and the like. In the description of FIG. 6, the operation of supplying a weight (filter processing) is omitted.

First, the description is made on an operation in which data obtained by the light exposure operation (Exp. A, w/o light exposure) in the (n−1)th frame is read out during the light exposure operation (Exp. B, w/light exposure) in the (n−1)th frame from Time T1 to Time T3.

Before Time T1, the potential of the wiring 121 is set to "H" so that the transistor 102 is turned on, and the data obtained by the Exp. A (w/o light exposure) operation in the (n−1)th frame is transferred to the node FD.

At Time T1, the potential of the wiring 121 is set to "L" and the potential of the wiring 122 is set to "H"; thus, the transistor 102 is turned off, and the potential of the node FD is retained. Moreover, the transistor 103 is turned on, and the potential of the node FDP becomes a reset potential (the potential of the wiring 115) "$V_{RES}$".

At Time T2, the potential of the wiring 122 is set to "L", whereby the transistor 103 is turned off, and the potential of the node FDP changes in accordance with the operation of the photoelectric conversion device 101. This operation corresponds to the Exp. B (w/light exposure) operation in the (n−1)th frame.

At Time T3, the potential of the wiring 121 is set to "H", whereby the transistor 102 is turned on, and the potential of the node FDP is transferred to the node FD.

Here, between Time T2 and Time T3, an operation in which wirings 123[1] to 123[*m*] (a row number of the pixel block 200 is shown in the brackets, and m is a natural number) and wirings 124[1] to 124[*m*] are sequentially set to "H" is performed, and the data obtained by the Exp. A (w/o light exposure) operation in the (n−1)th frame is read out. At the end of reading of all rows, the potentials of the wirings 123[1] to 123[*m*] are set to "H", so that the transistor 104 is turned on and the potential of the node FD is reset. The transfer of the potential of the node FDP at Time T3 to the node FD is performed after this reset operation. Note that this operation can be omitted.

Next, the description is made on an operation in which data obtained by the light exposure operation (Exp. B, w/light exposure) in the (n−1)th frame is read out during the light exposure operation (Exp. A, w/o light exposure) in the n-th frame from Time T4 to Time T6.

At Time T4, the potential of the wiring 122 is set to "H", whereby the transistor 103 is turned on, and the potential of the node FDP becomes the reset potential (the potential of the wiring 115) "$V_{RES}$".

At and after Time T5, the potential of the wiring 122 is set to "H" so that the transistor 103 is turned on. In other words, although this is a period for a light exposure operation, the potential of the node FDP is kept at "$V_{RES}$" because the reset potential is continuously supplied. This operation corresponds to the Exp. A (w/o light exposure) operation in the n-th frame.

At Time T6, the potential of the wiring 121 is set to "H", whereby the transistor 102 is turned on, and the potential of the node FDP is transferred to the node FD.

Here, in a period from Time T5 until Time T6, an operation in which the wirings 123[1] to 123[*m*] and 124[1] to 124[*m*] are sequentially set to "H" is performed, and data obtained by the Exp. B (w/light exposure) operation in the (n−1)th frame is read out. At the end of reading of all rows, the potentials of the wirings 123[1] to 123[*m*] are set to "H", so that the transistor 104 is turned on and the potential of the node FD is reset. The transfer of the potential of the node FDP at Time T6 to the node FD is performed after this reset operation. Note that this operation can be omitted.

Conducting the above operation enables the light exposure operation and the reading operation to be performed concurrently.

Next, a reading operation with supply of a weight (filter processing) and a product-sum operation will be described with reference to a timing chart in FIG. 7A. The operation in FIG. 7A corresponds to an operation in the case where the same weight is supplied to one column of the pixels 100 included in the pixel block 200 as illustrated in FIG. 7B.

Figure 7A:
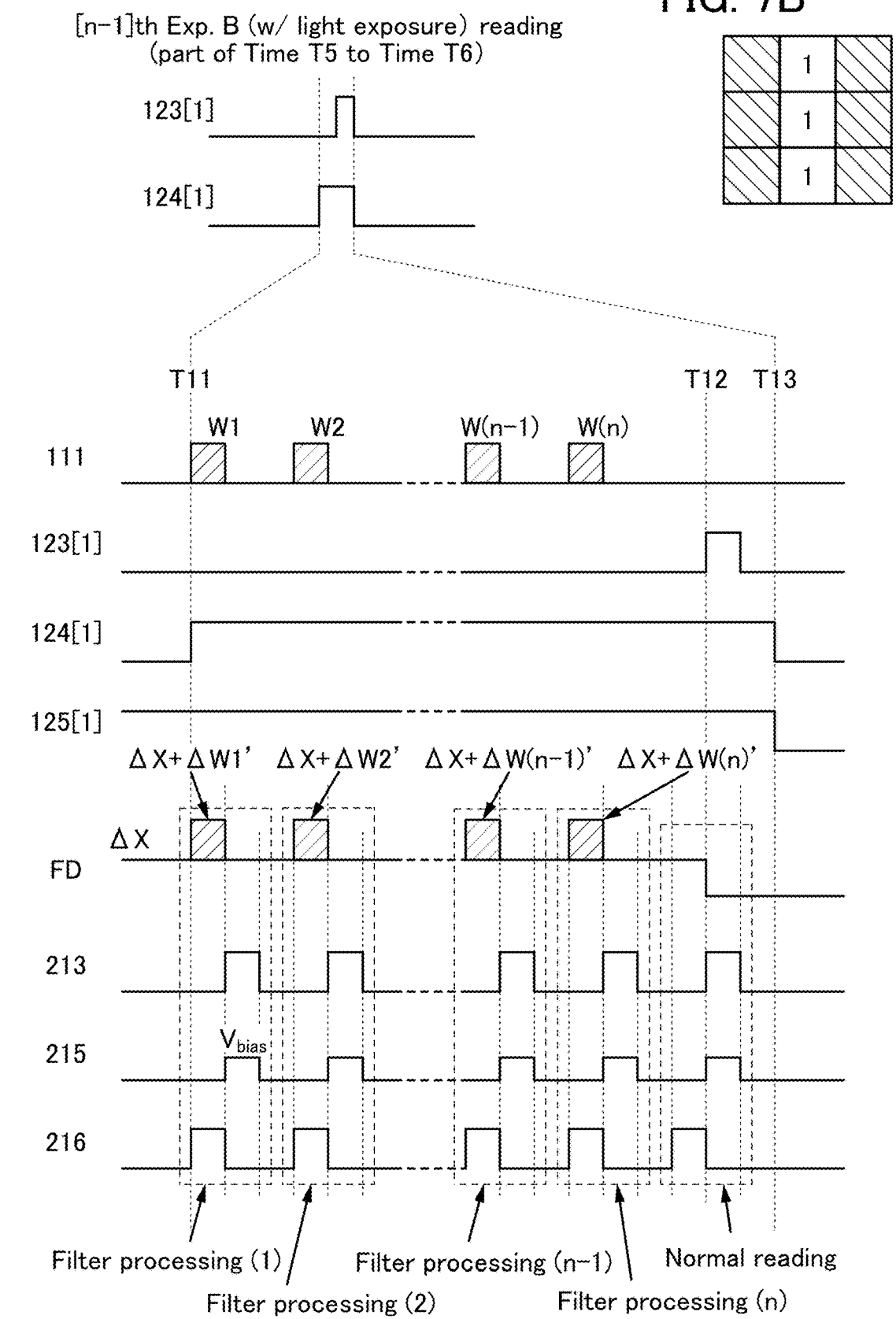
FIG. 7A is a timing chart showing the operation of an imaging device.
Figure 7B:
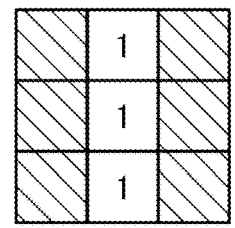
FIG. 7B is a diagram illustrating a filter supplied to a pixel block.

FIG. 7A is a timing chart in which part of Time T5 to Time T6 (the wiring 123[1] and the wiring 124[1]) in FIG. 6 is enlarged. FIG. 7A also shows the potentials of a wiring 125[1], the node FD, the wiring 111, and the wiring 213, the wiring 215, and the wiring 216 in the circuit 201. The operation described next is an operation of reading out data with light exposure and data in which a weight is added to the data. The circuit 201 can obtain a difference between these data and read out the aforementioned data A.

Note that before Time T11 (corresponding to Time T5 in FIG. 6), data (ΔX) obtained by the Exp. B (w/light exposure) operation in the (n−1)th frame is transferred to and retained at the node FD. At this time, the transistor 107 is on, and a potential "L (=0)" of the wiring 111 is supplied to the other electrode of the capacitor 108. Moreover, an appropriate analog potential is supplied to the gate of the transistor 207 (see FIG. 2).

At Time T11, a weight W1 is supplied to the wiring 111 and the potential of the wiring 125 is set to "H"; thus, the transistor 107 is turned on, and a potential "W1" is written to the other electrode of the capacitor 108. Moreover, a potential change amount ("ΔW1'") of the other electrode of the capacitor 108 is added to the node FD by capacitive coupling of the capacitor 108, whereby the potential of the node FD is changed to "ΔX+ΔW1'". Note that when the capacitance of the capacitor 108 is sufficiently larger than the capacitance of the node FD, "ΔW1" and "ΔW1'" are substantially the same values.

When the potentials of the wiring 124[1], the wiring 125[1], and the wiring 216 (see FIG. 2) are set to "H" at Time T11, the transistor 106 is turned on, and a current corresponding to the potential of the node FD flows from the wiring 112 to the transistor 105. Moreover, the transistor 203 in the circuit 201 is turned on, and the potential of the wiring 211 becomes a potential "Vr" of the wiring 218. In other words, when the potential of the other electrode of the capacitor 202 is an output potential at the time of adding the weight to the image data obtained in the pixel 100, the potential of the one electrode of the capacitor 202 is initialized to the potential "Vr".

Subsequently, the potential of the wiring 111 is set to "L (=0)", the potential of the wiring 216 is set to "L", the potential of the wiring 213 is set to "H", and the potential of the wiring 215 is set to an appropriate analog potential such as "Vbias"; thus, a current corresponding to the potential ("ΔX") of the node FD flows from the wiring 112 to the transistor 105. Here, the potential of the other electrode of the capacitor 202 changes in accordance with the current flowing through the wiring 112, and a potential change amount Y is added to the potential "Vr" of the wiring 211 by capacitive coupling.

Accordingly, the potential of the wiring 211 becomes "Vr+Y". Here, given that Vr=0, Y is the difference itself, which means that the data A in the description of the circuit 201 is calculated. The circuit 201 can output a signal potential corresponding to the data A by the source follower operation. The processing thus far is filter processing (1) illustrated in FIG. 7.

Processing similar to the above is performed using weights W2 to W(n) (n is a natural number) until Time T12, whereby filter processing up to filter processing (n) can be conducted.

Between Time T12 and Time T13, in preparation for the next reading from the node FDP, the potential of the wiring 123[1] is set to "H" and a reset operation of the node FD is performed.

Around Time T12, a normal reading operation, in which a weight is not added, is performed. In this operation, the image data is read out without adding a weight before Time T12, and the node FD is reset and reading is performed at Time T12. This operation corresponds to an operation of subtracting noise at the time of resetting from the image data, and enables image data with little noise to be obtained.

Similarly, from Time T2 to Time T3 in FIG. 6, the data B, which is a difference between data without light exposure and data in which a weight is added to the data, can be calculated. Note that in a period for reading out data without light exposure, the above-described normal reading operation is unnecessary.

Figure 8A:
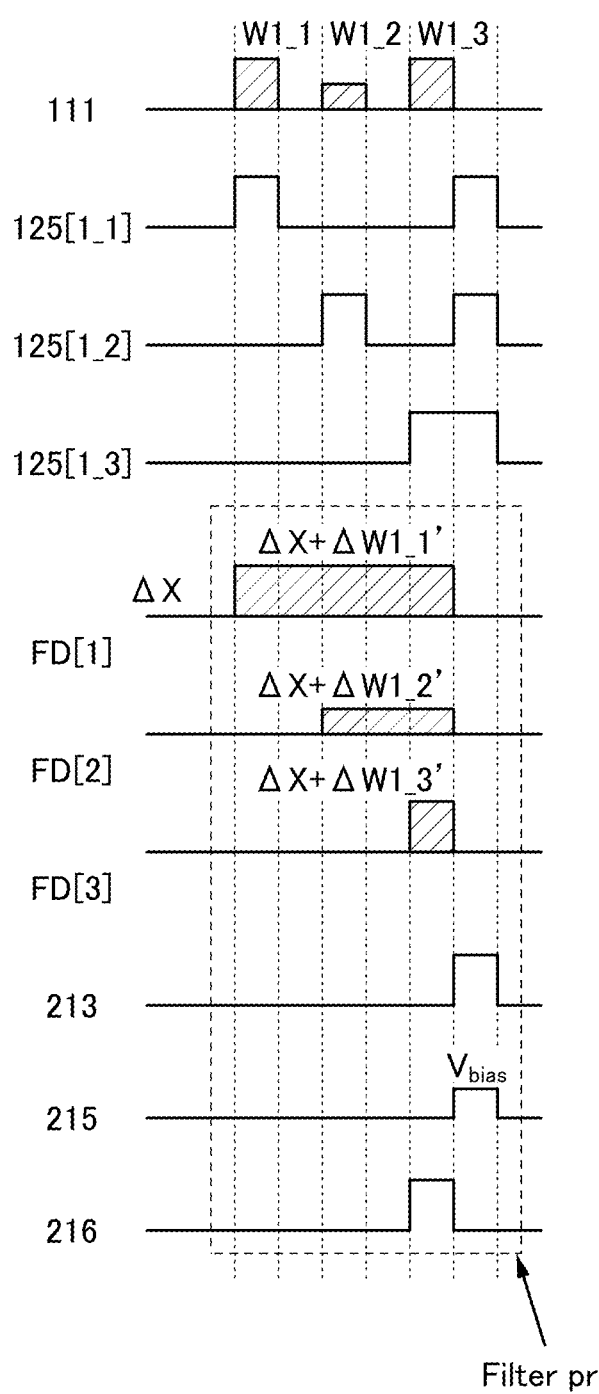
FIG. 8A is a timing chart showing the operation of an imaging device.

Next, an operation in the case where weights for one column of the pixels 100 included in the pixel block 200 are not the same will be described with reference to a timing chart in FIG. 8A. FIG. 8A shows an operation corresponds to one filter processing.

Figure 8B:
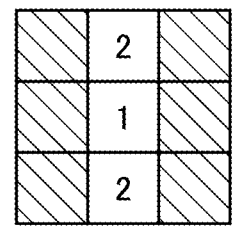
FIG. 8B is a diagram illustrating a filter supplied to a pixel block.

For example, in the case where weights supplied to one column of the pixels 100 included in the pixel block 200 are not the same as illustrated in FIG. 8B, the potentials of a wiring 125[1_1] to a wiring 125[1_3] ("a row number of the pixel block a row number of the pixel 100" are shown in the brackets) are set to "H" at different timings, and different weights (W1_1, W1_2, and W1_3) are supplied to the respective pixels 100.

From the above operation, the potential of FD[1] (the node FD of the pixel 100 in the first row of the pixel block 200) becomes ΔX+ΔW1_1'. The potential of FD[2] (the node FD of the pixel 100 in the second row of the pixel block 200) becomes ΔX+ΔW1_2'. The potential of FD[3] (the node FD of the pixel 100 in the third row of the pixel block 200) becomes ΔX+ΔW1_3'.

The potential of the wiring 216 is set to "H" in the above state, whereby in the circuit 201, the sum of data to which the weights are added is converted into the potential "Vr" of the wiring 211 as in the operation described above. Lastly, the weight added to the node FD is set to 0 and differential operation using capacitive coupling is performed, whereby the data A or the data B can be calculated.

The data A and the data B output from the circuit 201 through the above operation are input to the circuit 301. The circuit 301 performs operation for obtaining a difference between the data A and the data B, so that unnecessary offset components other than the product of the image data and the weight coefficient can be eliminated. The circuit 301 may have a structure in which the difference is calculated by utilizing a memory circuit (also referred to as a storage circuit) and software processing, as well as a structure including an arithmetic circuit such as the circuit 201.

The weight coefficient can be output from the circuit 313 illustrated in FIG. 1 to the wiring 111, and it is preferable to rewrite the weight coefficient once or more in a frame period. As the circuit 313, a decoder can be used. The circuit 313 may include a D/A converter or an SRAM.

A signal can be output from the circuit 311 to the wiring 125 for selecting the pixel 100 to which the weight coefficient is input. As the circuit 311, a decoder or a shift register can be used.

A signal can be output from the circuit 312 to the wiring 124 connected to the gate of the transistor 106 in the pixel 100, for example. As the circuit 312, a decoder or a shift register can be used.

Note that the above is the description of the operation in which the data A and the data B are obtained every frame and the circuit 301 performs arithmetic operation for obtaining their difference. Here, when the weight does not change and the obtained image data does not degrade, the data B is always the same data. Therefore, when the circuit 301 is provided with a memory function and stores the data B, the operation of obtaining the data B every frame can be eliminated. Note that a plurality of pieces of data B corresponding to a plurality of weights may be stored in the memory.

Figure 9:
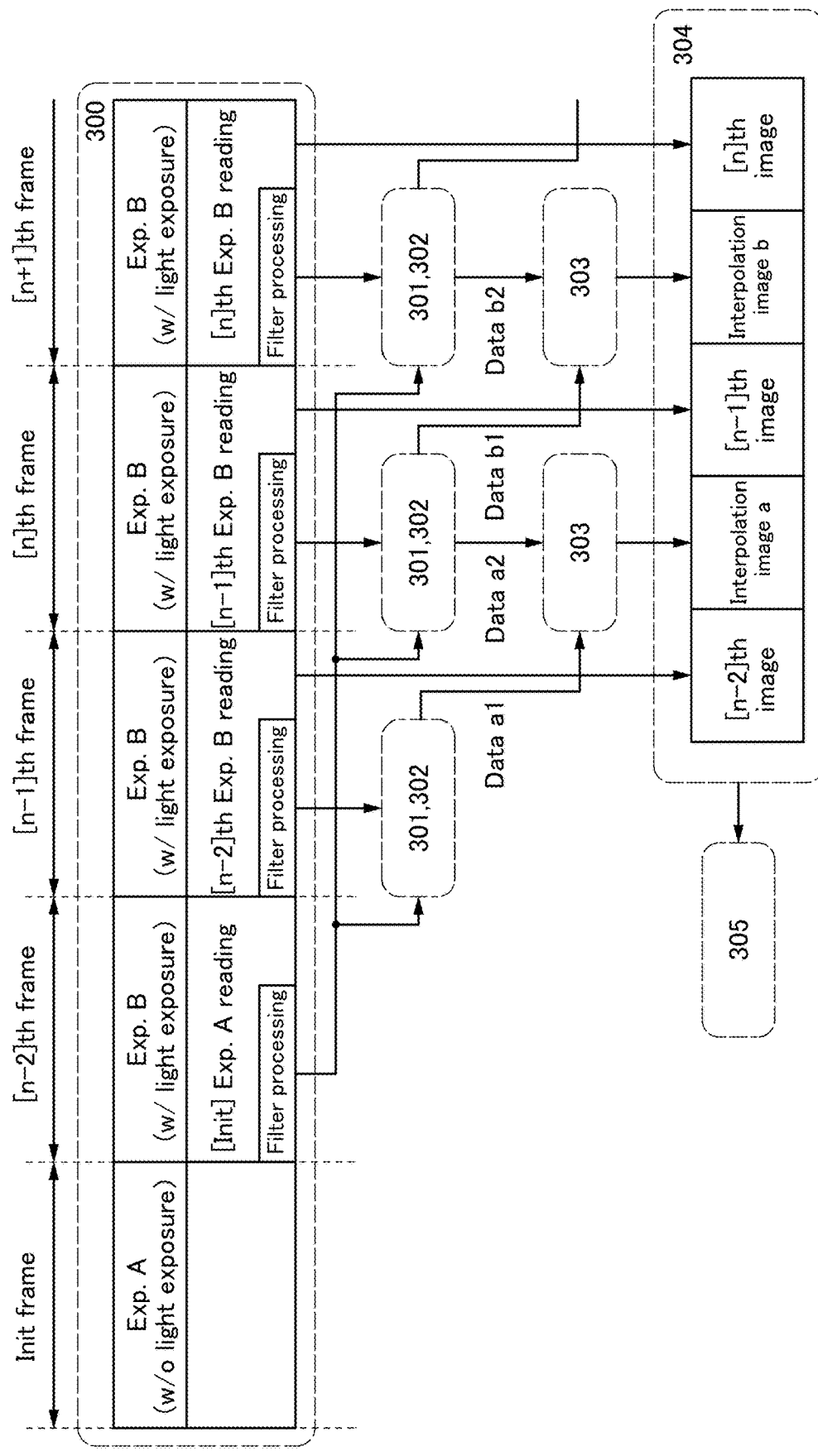
FIG. 9 is a diagram illustrating an imaging system.

FIG. 9 is a diagram showing the operation in the above case. The light exposure operation (Exp. A) corresponding to "without light exposure" is performed in an initial (Init) frame, and the light exposure operation (Exp. B) corresponding to "with light exposure" is performed successively in the subsequent frames. The other operations are similar to the description for FIG. 5 to FIG. 8. By performing this operation, the frame frequency can be further increased.

Note that although the processing of data of the captured image is described above, image data without processing can be extracted in the imaging device of one embodiment of the present invention.

In the product-sum operation, pixels in a plurality of rows are preferably selected at a time. Meanwhile, in the case where only imaging data is extracted, data is desirably extracted from pixels in one row. In one embodiment of the present invention, the circuit 312 for selecting the pixels 100 has a function of changing the number of rows to be selected. To select one pixel, a negative weight or the like is supplied to pixels other than the pixel to be selected, for example, such that the transistors 105 are not turned on.

<Shift Register>

Figure 10:
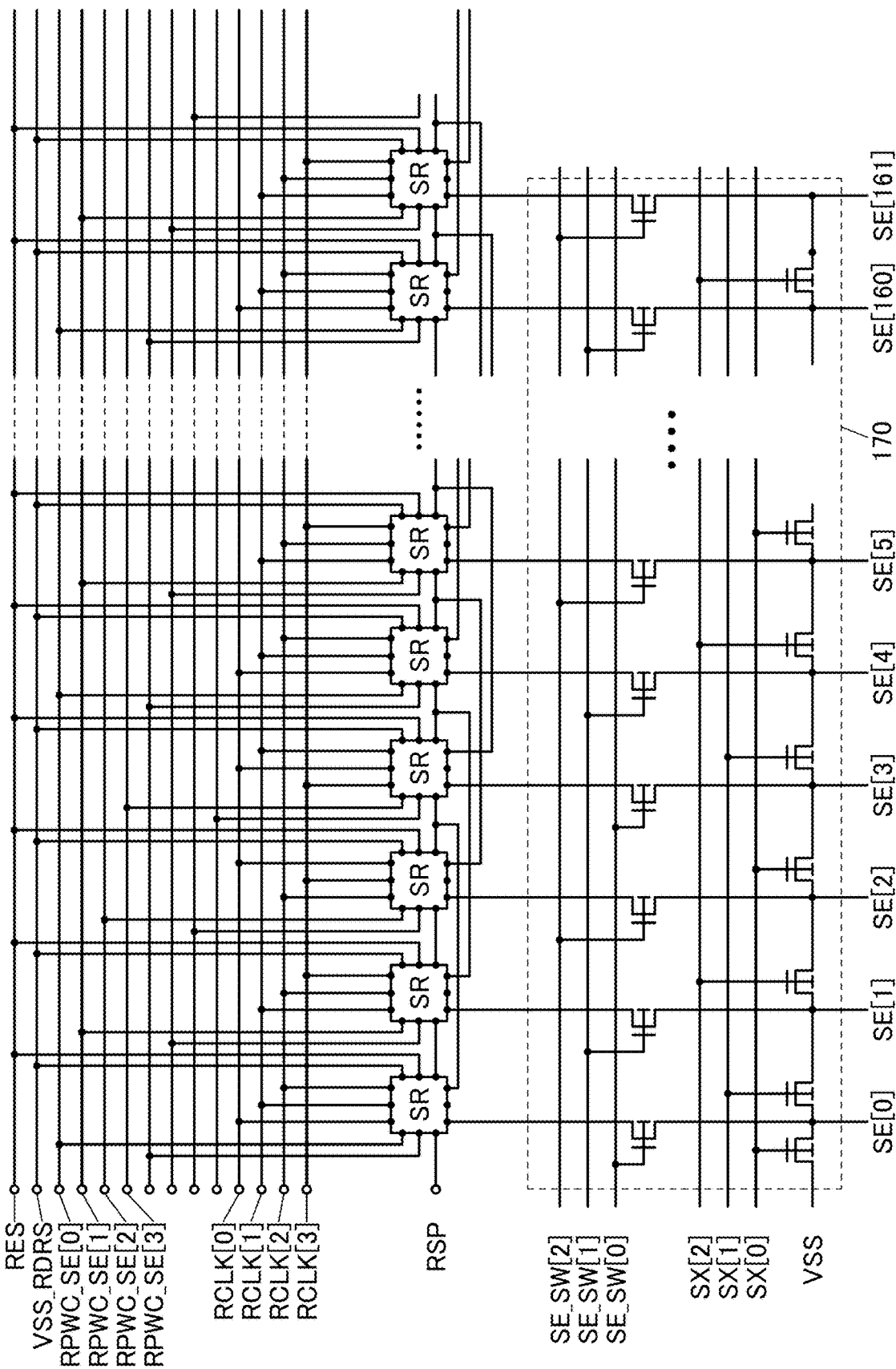
FIG. 10 is a diagram illustrating a circuit 312.

FIG. 10 illustrates an example of a circuit that can be used as the circuit 312. The circuit is a shift register circuit in which a plurality of logic circuits (SR) are electrically connected. Signal lines such as a wiring RES, a wiring VSS_RDRS, wirings RPWC_SE[0:3], wirings RCLK[0:3], and a wiring RSP are connected to the logic circuits (SR). When appropriate signal potentials are input to the signal lines, selection signal potentials can be sequentially output from the logic circuits (SR).

A circuit 170 is electrically connected to the logic circuits (SR). A plurality of transistors are provided in the circuit 170 and are connected to signal lines such as wirings SE_SW[0:2] and wirings SX[0:2]. When appropriate signal potentials are input to the signal lines, conduction of the transistors is controlled. By the control by the circuit 170, the number of rows of pixels to be selected can be changed.

One of a source and a drain of one transistor is electrically connected to an output terminal of one logic circuit (SR), and a wiring SE is electrically connected to the other of the source and the drain of the transistor. The wiring SE is electrically connected to the wiring 124 for selecting the pixel 100.

A signal potential supplied from the wiring SE_SW[0] can be input to a gate of the transistor connected to a wiring SE[0]. A signal potential supplied from the wiring SE_SW[1] can be input to a gate of the transistor connected to a wiring SE[1]. A signal potential supplied from the wiring SE_SW[2] can be input to a gate of the transistor connected to a wiring SE[2]. Signal potentials supplied from the wirings SE_SW[0:2] can be input to gates of the transistors connected to a wiring SE[3] and subsequent wirings SE in the same order.

Adjacent wirings SE are electrically connected to each other through one transistor, and the wiring SE[0] is electrically connected to a power supply line (VSS) through one transistor.

A signal potential supplied from the wiring SX[0] can be input to a gate of the transistor that electrically connects the power supply line (VSS) and the wiring SE[0]. A signal potential supplied from the wiring SX[1] can be input to a gate of the transistor that electrically connects the wiring SE[0] and the wiring SE[1]. A signal potential supplied from the wiring SX[2] can be input to a gate of the transistor that electrically connects the wiring SE[1] and the wiring SE[2]. Signal potentials supplied from the wirings SX[0:2] can be input to gates of the transistors that electrically connect the subsequent adjacent wirings SE in the same order.

Figure 11:
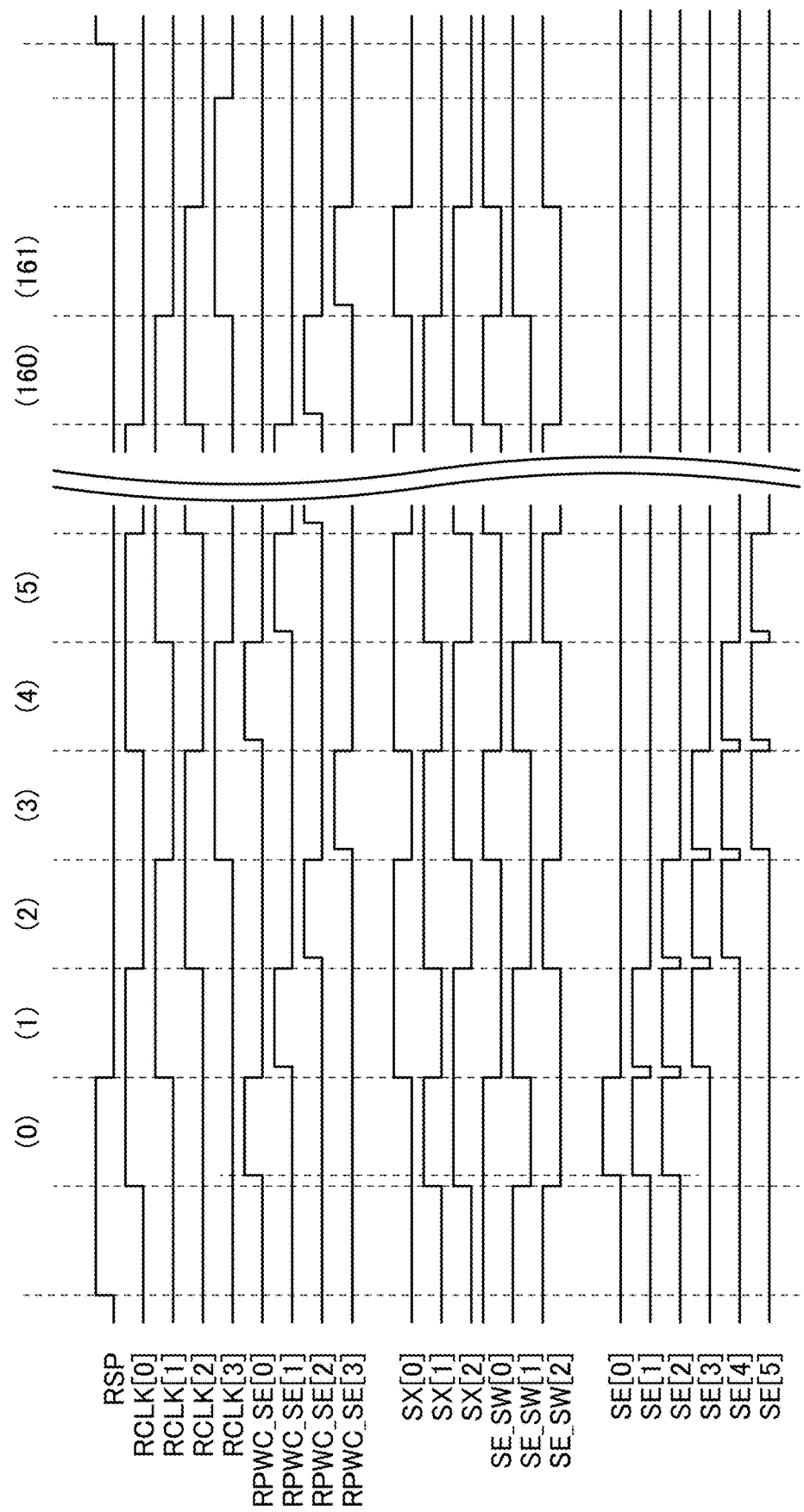
FIG. 11 is a timing chart showing the operation of the circuit 312.

FIG. 11 is a timing chart showing an operation in which a plurality of rows (three rows) are selected at a time by the circuit illustrated in FIG. 10. Note that (0) to (161) correspond to timings at which the logic circuits (SR) output signal potentials to the wirings SE.

When the potential of the wiring SX[0] is "L", the potential of the wiring SX[1] is "H", the potential of the wiring SX[2] is "H", the potential of the wiring SE_SW[0] is "H", the potential of the wiring SE_SW[1] is "L", and the potential of the wiring SE_SW[2] is "L" at the timing (0), conduction of the transistors is controlled and "H", "H", and "H" are output to the wiring SE[0], the wiring SE[1], and the wiring SE[2], respectively. To the other wirings SE, "L" is output.

Thus, three rows can be selected at a time, and product-sum operation of pixels in three rows and three columns can be performed, for example.

When the potential of the wiring SX[0] is "H", the potential of the wiring SX[1] is "L", the potential of the wiring SX[2] is "H", the potential of the wiring SE_SW[0] is "L", the potential of the wiring SE_SW[1] is "H", and the potential of the wiring SE_SW[2] is "L" at the timing (1), conduction of the transistors is controlled and "L", "H", "H", and "H" are output to the wiring SE[0], the wiring SE[1], the wiring SE[2], and the wiring SE[3], respectively. To the other wirings SE, "L" is output.

That is, at the timing (1), product-sum operation with a stride of 1, in which one-row shift from the timing (0) is made, can be performed.

Figure 12:
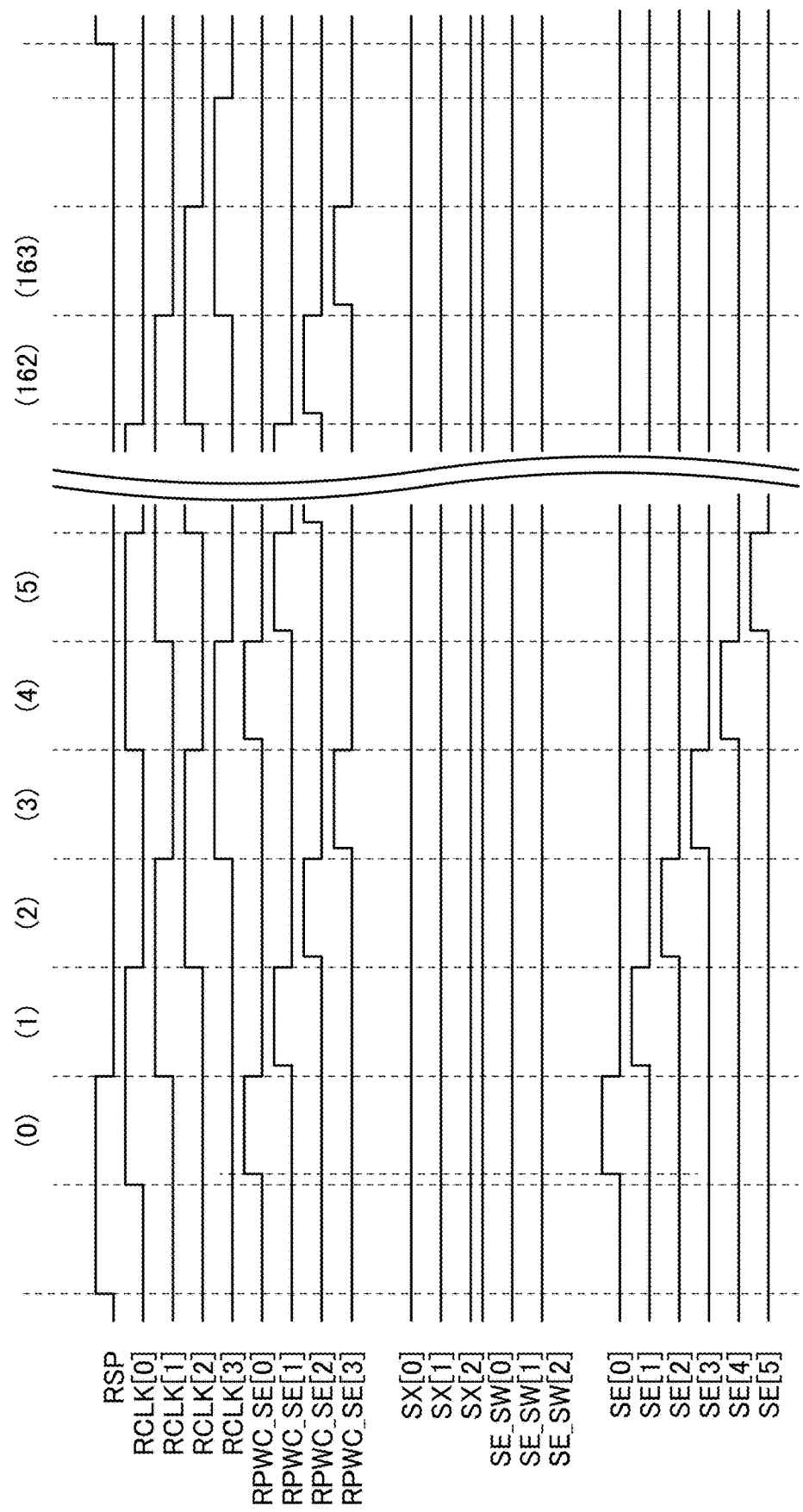
FIG. 12 is a timing chart showing the operation of the circuit 312.

FIG. 12 is a timing chart showing an operation in which one row is selected by the circuit illustrated in FIG. 10.

In the operation according to the timing chart, the potentials of the wirings SE_SW[0:2] always remain at "H", and the potentials of the wirings SX[0:2] always remain at "L".

Thus, outputs of the logic circuits (SR) are input to the wirings SE without any changes, which enables selection of one row at a time.

<Circuits 301 and 302>

Figure 13A:
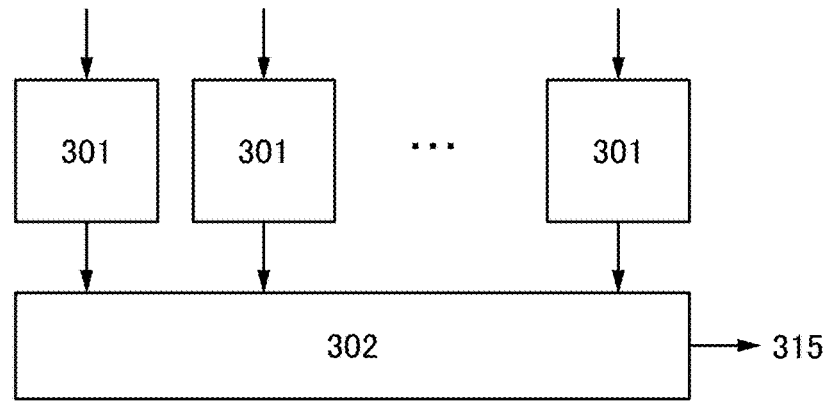
FIG. 13A and FIG. 13B are diagrams illustrating circuits 301 and a circuit 302.

FIG. 13A is a diagram illustrating the circuits 301 connected to the circuit 201, and the circuit 302. Product-sum operation result data output from the circuit 201 is sequentially input to the circuits 301. The circuit 301 may have a variety of arithmetic operation functions in addition to the above-described function of calculating the difference between the data A and the data B. For example, the circuit 301 can have a configuration similar to that of the circuit 201. Alternatively, the function of the circuit 301 may be replaced by software processing.

The circuit 301 may include a circuit that performs arithmetic operation of an activation function. A comparator circuit can be used as the circuit, for example. A comparator circuit outputs a result of comparing input data and a set threshold as binary data. In other words, the pixel blocks 200 and the circuits 301 can operate as some components of a neural network.

The circuit 301 may include an A/D converter. When image data is output to the outside without undergoing arithmetic operation or the like, the analog data can be converted into digital data by the circuit 301.

In the case where the data output from the pixel block 200, which corresponds to image data of a plurality of bits, can be binarized by the circuits 301, the binarization can be rephrased as compression of image data.

Data output from the circuits 301 is sequentially input to the circuit 302. The circuit 302 can have a structure including a latch circuit, a shift register, and the like, for example. With this structure, parallel-to-serial conversion can be performed, and data input in parallel can be output to the wiring 315 as serial data. The connection destination of the wiring 315 is not limited. For example, the wiring 315 can be connected to a neural network, a memory device, a communication device, or the like.

Figure 13B:
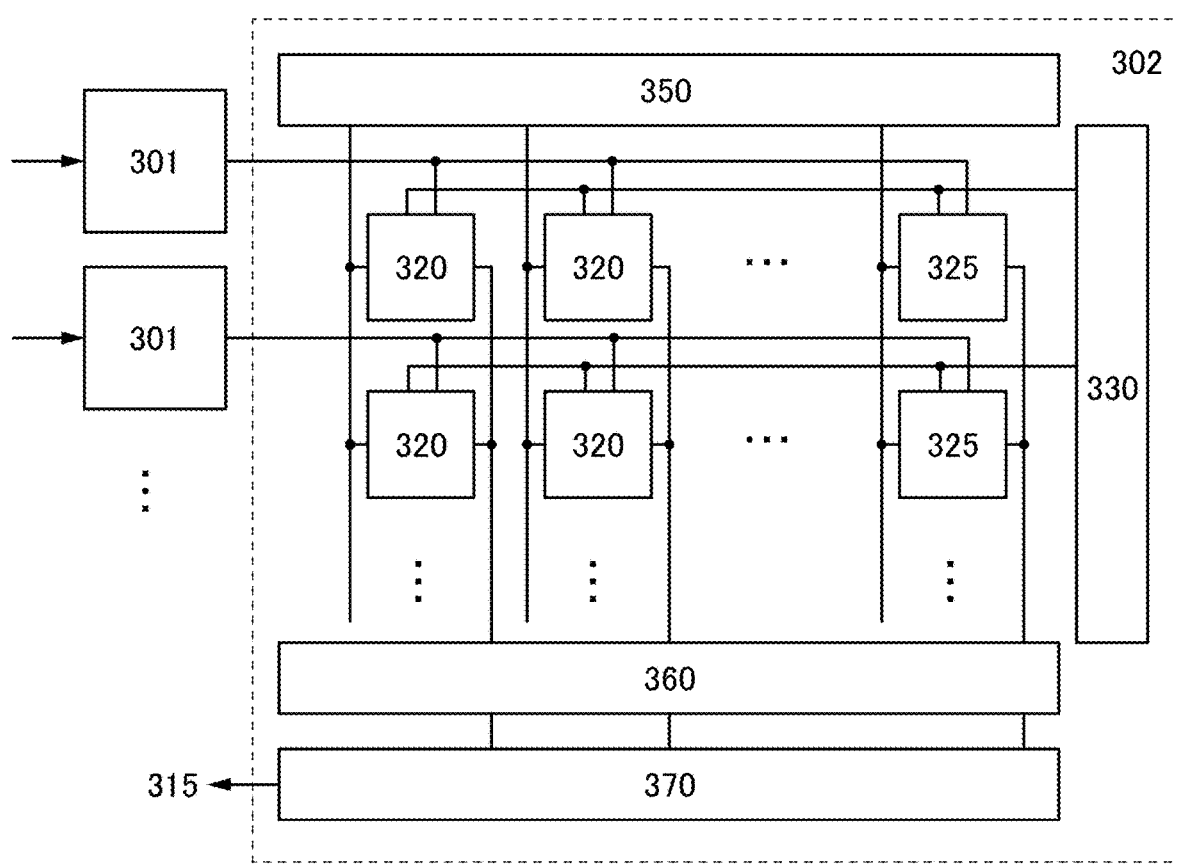

As illustrated in FIG. 13B, the circuit 302 may have a structure of a neural network. The neural network includes memory cells arranged in a matrix, and each memory cell retains a weight coefficient. Data output from the circuits 301 is input to corresponding memory cells 320, and product-sum operation can be performed. Note that the number of memory cells illustrated in FIG. 12B is an example, and the number is not limited.

The neural network illustrated in FIG. 13B includes the memory cells 320 and reference memory cells 325 that are arranged in a matrix, a circuit 330, a circuit 350, a circuit 360, and a circuit 370.

Figure 14:
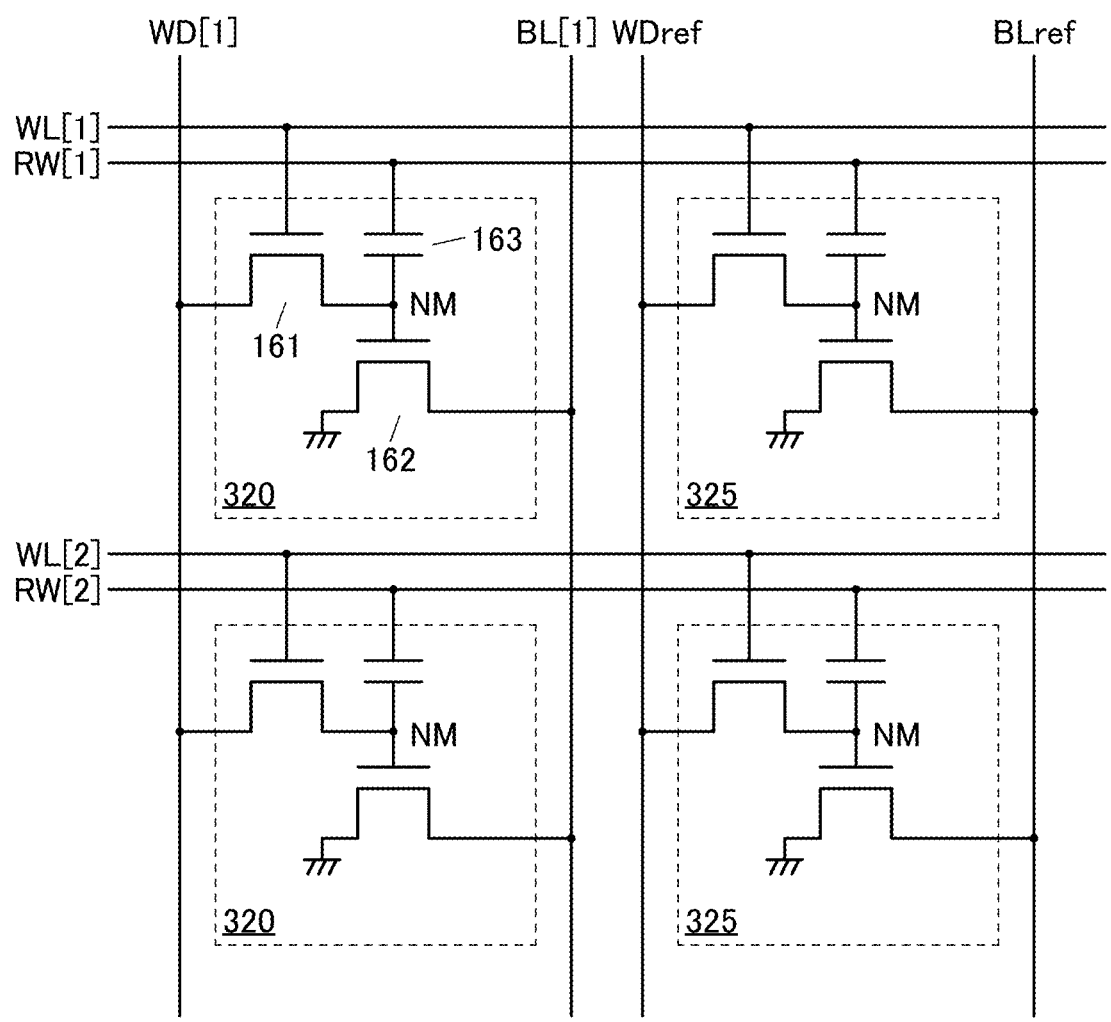
FIG. 14 is a diagram illustrating memory cells.

FIG. 14 illustrates an example of the memory cells 320 and the reference memory cells 325. The reference memory cells 325 are provided in one given column. The memory cells 320 and the reference memory cells 325 have similar configurations and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point where the one of the source and the drain of the transistor 161, the gate of the transistor 162, and the one electrode of the capacitor 163 are connected to each other is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be provided between the circuit 301 and the memory cells.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360. The circuit 360 can have a configuration equivalent to that of the circuit 201. By the circuit 360, a signal of a product-sum operation result from which offset components are eliminated can be obtained.

The circuit 360 is electrically connected to the circuit 370. The circuit 370 can also be referred to as an activation function circuit. The activation function circuit has a function of performing arithmetic operation for converting the signal input from the circuit 360 in accordance with a predefined activation function. As the activation function, for example, a sigmoid function, a tanh function, a softmax function, a ReLU function, a threshold function, or the like can be used. The signal converted by the activation function circuit is output to the outside as output data.

Figure 15A:
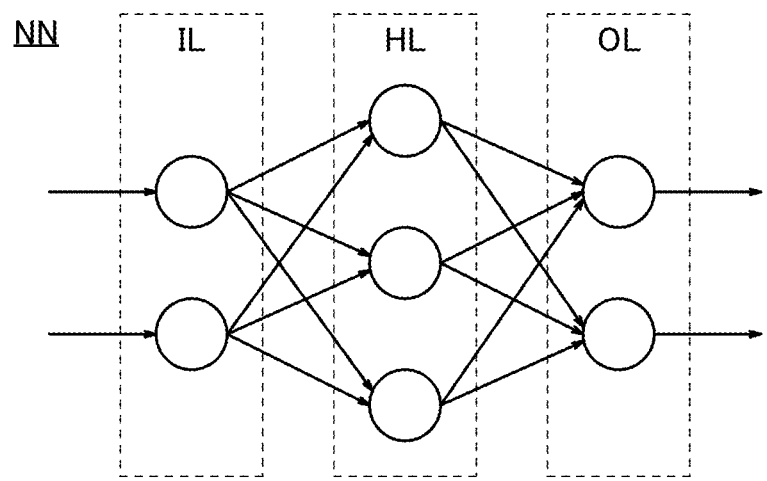
FIG. 15A and FIG. 15B are diagrams illustrating a structure example of a neural network.

As illustrated in FIG. 15A, a neural network NN can be formed of an input layer IL, an output layer OL, and an intermediate layer (hidden layer) HL. The input layer IL, the output layer OL, and the intermediate layer HL each include one or more neurons (units). Note that the number of intermediate layers HL may be one, or two or more. A neural network including two or more intermediate layers HL can also be referred to as a DNN (deep neural network). Learning using a deep neural network can also be referred to as deep learning.

Input data is input to neurons in the input layer IL. An output signal of a neuron in the previous layer or the subsequent layer is input to each neuron in the intermediate layer HL. Output signals of the neurons in the previous layer are input to each neuron in the output layer OL. Note that each neuron may be connected to all the neurons in the previous and subsequent layers (full connection), or may be connected to some of the neurons.

Figure 15B:
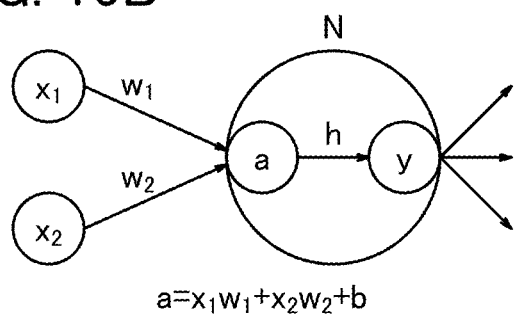

FIG. 15B shows an example of arithmetic operation with neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Subsequently, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

This embodiment can be combined with the description of the other embodiments as appropriate.

Embodiment 2

In this embodiment, structure examples and the like of the imaging device of one embodiment of the present invention will be described.

STRUCTURE EXAMPLES

Figure 16A:
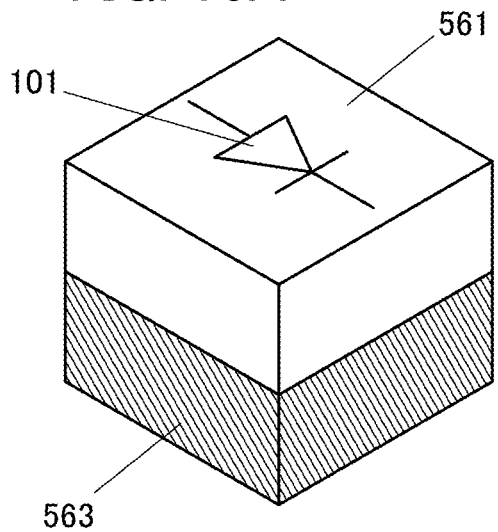
FIG. 16A to FIG. 16D are diagrams illustrating structures of a pixel of an imaging device.

FIG. 16A is a diagram illustrating an example of a structure of a pixel in the imaging device; the pixel can have a stacked-layer structure of a layer 561 and a layer 563.

Figure 17A:
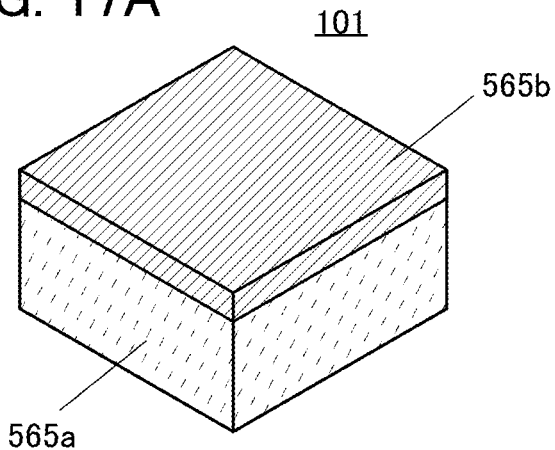
FIG. 17A to FIG. 17C are diagrams illustrating structures of a photoelectric conversion device.

The layer 561 includes the photoelectric conversion device 101. The photoelectric conversion device 101 can include a layer 565a and a layer 565b as illustrated in FIG. 17A. Note that the term "layer" may be replaced with the term "region" in some cases.

The photoelectric conversion device 101 illustrated in FIG. 17A is a pn-junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn-junction photodiode can be typically formed using single crystal silicon.

Figure 17B:
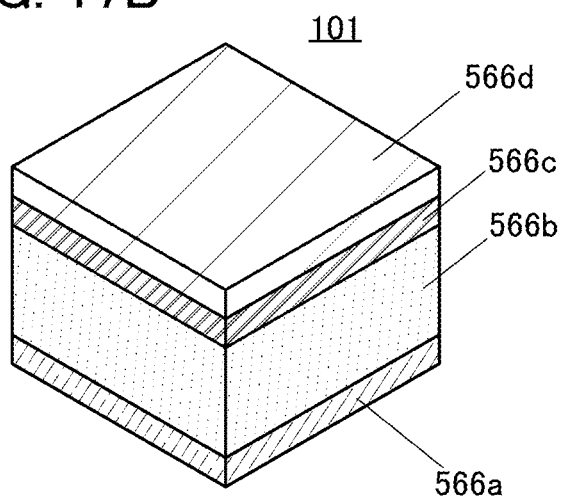

The photoelectric conversion device 101 included in the layer 561 may have a stacked-layer structure of a layer 566a, a layer 566b, a layer 566c, and a layer 566d as illustrated in FIG. 17B. The photoelectric conversion device 101 illustrated in FIG. 17B is an example of an avalanche photodiode; the layer 566a and the layer 566d correspond to electrodes, and the layers 566b and 566c correspond to a photoelectric conversion portion.

The layer 566a is preferably a low-resistance metal layer or the like. For example, aluminum, titanium, tungsten, tantalum, silver, or a stack thereof can be used.

A conductive layer having a high visible-light transmitting property is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

The layers 566b and 566c of the photoelectric conversion portion can be used to form a pn-junction photodiode containing a selenium-based material in a photoelectric conversion layer, for example. A selenium-based material, which is a p-type semiconductor, is preferably used for the layer 566b, and gallium oxide or the like, which is an n-type semiconductor, is preferably used for the layer 566c.

A photoelectric conversion device using a selenium-based material has characteristics of high external quantum efficiency with respect to visible light. In the photoelectric conversion device, electrons can be greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a visible-light transmitting property. For example, zinc oxide, gallium oxide, indium oxide, tin oxide, or mixed oxide thereof can be used. In addition, these materials have a function of a hole-injection blocking layer, so that a dark current can be decreased.

Figure 17C:
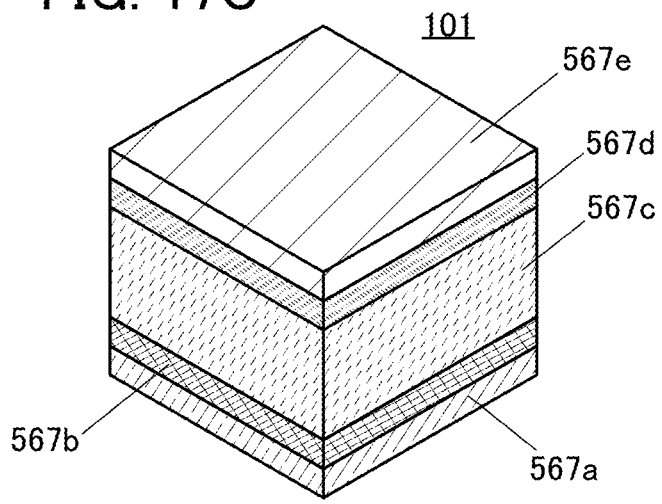

The photoelectric conversion device 101 included in the layer 561 may have a stacked-layer structure of a layer 567a, a layer 567b, a layer 567c, a layer 567d, and a layer 567e as illustrated in FIG. 17C. The photoelectric conversion device 101 illustrated in FIG. 17C shows an example using an organic optical conductive film; the layer 567a is a lower electrode, the layer 567e is an upper electrode having a light-transmitting property, and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (a bulk heterojunction structure) can be used.

For the layer 563 illustrated in FIG. 16A, a silicon substrate can be used, for example. The silicon substrate includes Si transistors and the like. With the use of the Si transistors, as well as a pixel circuit, a circuit for driving the pixel circuit, a circuit for reading an image signal, an image processing circuit, a neural network, a communication circuit, or the like can be formed. Moreover, a memory circuit such as a DRAM (Dynamic Random Access Memory), a CPU (Central Processing Unit), an MCU (Micro Controller Unit), or the like may be formed. Note that the above-described circuits except the pixel circuit are referred to as functional circuits in this embodiment.

For example, some or all of transistors included in the pixel circuits (the pixels 100) and the functional circuits (e.g., the circuits 201, 301, 302, 303, 304, 305, 311, 312, and 313), which are described in Embodiment 1, can be provided in the layer 563.

Figure 16B:
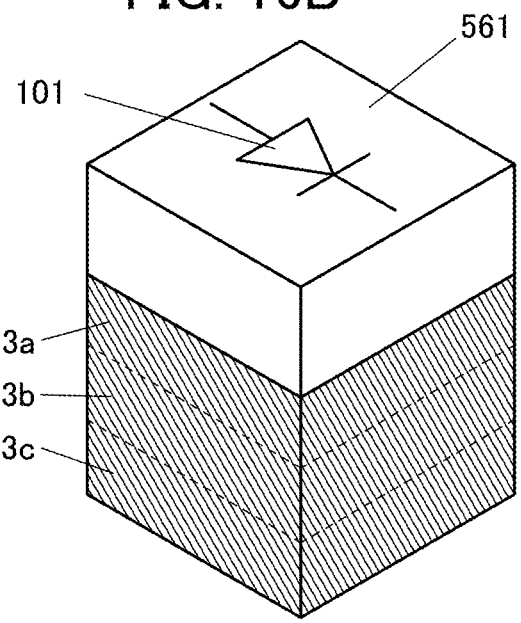

The layer 563 may be a stack of a plurality of layers as illustrated in FIG. 16B. Although FIG. 16B illustrates an example of three layers 563a, 563b, and 563c, the layer 563 may be a stack of two layers. Alternatively, the layer 563 may be a stack of four or more layers. These layers can be stacked by, for example, a bonding step or the like. With such a structure, the pixel circuits and the functional circuits are distributed in a plurality of layers, and the pixel circuits and the functional circuits can be provided to overlap each other; thus, a small and highly functional imaging device can be fabricated.

Figure 16C:
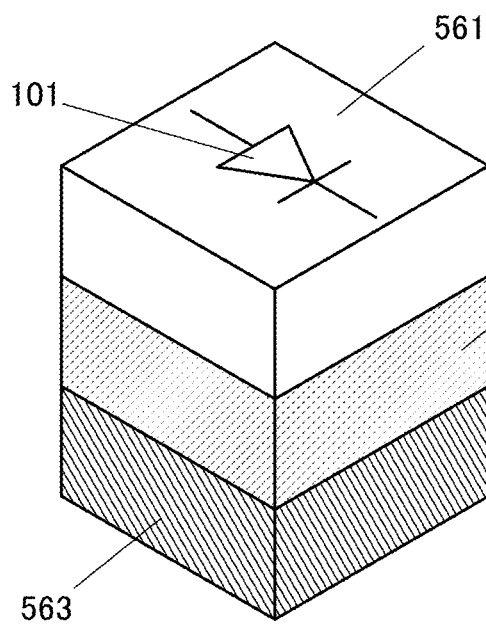

The pixel may have a stacked-layer structure of the layer 561, a layer 562, and the layer 563 as illustrated in FIG. 16C.

The layer 562 can include OS transistors. One or more of the above functional circuits may be formed using OS transistors. Alternatively, one or more of the functional circuits may be formed using Si transistors included in the layer 563 and OS transistors included in the layer 562. Alternatively, with the layer 563 being a support substrate such as a glass substrate, the functional circuits may be formed using OS transistors included in the layer 562.

For example, a normally-off CPU (also referred to as "Noff-CPU") can be formed using OS transistors and Si transistors. Note that the Noff-CPU is an integrated circuit including a normally-off transistor, which is in a non-conducting state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can hold data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in the operating speed.

Figure 16D:
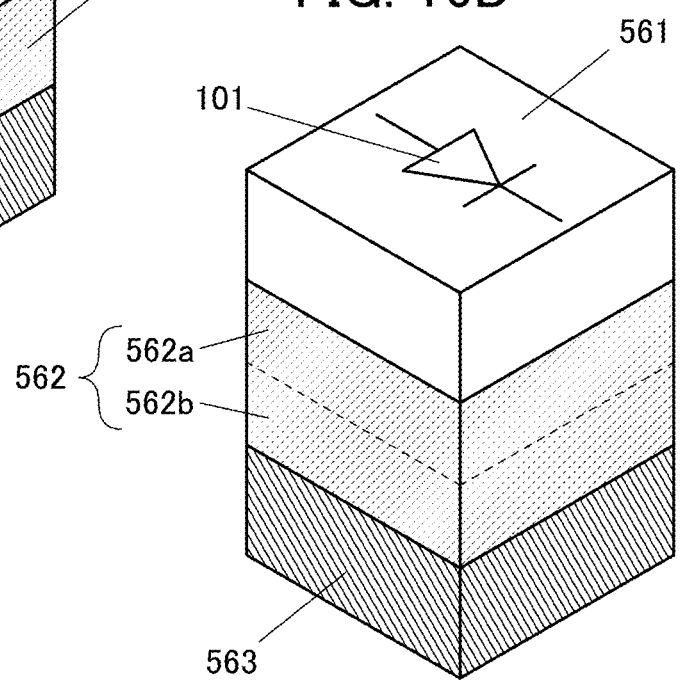

The layer 562 may be a stack of a plurality of layers as illustrated in FIG. 16D. Although FIG. 16D illustrates an example of two layers 562a and 562b, the layer 562 may be a stack of three or more layers. These layers can be formed so as to be stacked over the layer 563, for example. Alternatively, the layer 562 may be formed by bonding a layer formed over the layer 563 and a layer formed over the layer 561.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, and the like do not occur, which are different from those of a Si transistor. Hence, the use of an OS transistor enables formation of a circuit having high withstand voltage and high reliability. Moreover, variations in electrical characteristics due to crystallinity unevenness, which are caused in Si transistors, are less likely to occur in OS transistors.

A semiconductor layer included in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be formed by, for example, a sputtering method, an ALD (Atomic layer deposition) method, or an MOCVD (Metal organic chemical vapor deposition) method.

In the case where the In-M-Zn-based oxide is formed by a sputtering method, it is preferable that the atomic ratio of the metal elements in a sputtering target satisfy In≥M and Zn≥M. The atomic ratio of the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of the metal elements of the sputtering target in a range of ±40%.

An oxide semiconductor with a low carrier density is used for the semiconductor layer. For example, for the semiconductor layer, it is possible to use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having an appropriate composition can be used depending on required semiconductor characteristics and electrical characteristics (e.g., field-effect mobility and threshold voltage) of the transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal (the concentration obtained by secondary ion mass spectrometry) in the semiconductor layer is set lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set lower than or equal to $5\times10^{18}$ atoms/$cm^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. If the channel formation region in the oxide semiconductor includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of the non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition in which materials are separated into indium oxide (hereinafter $InO_{X1}$, where X1 is a real number greater than 0) or indium zinc oxide (hereinafter $In_{X2}Zn_{Y2}O_{Z2}$, where X2, Y2, and Z2 are real numbers greater than 0), and gallium oxide (hereinafter $GaO_{X3}$, where X3 is a real number greater than 0) or gallium zinc oxide (hereinafter $Ga_{X4}Zn_{Y4}O_{Z4}$, where X4, Y4, and Z4 are real numbers greater than 0), for instance, to form a mosaic pattern, and $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region is regarded as having a higher In concentration than the second region.

Note that IGZO is a common name, which may specify a compound containing In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component are observed in part of a CAC-OS and nanoparticle regions containing In as a main component are observed in part of the CAC-OS, and these nanoparticle regions are randomly dispersed to form a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible, and for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using a CAC-OS has high reliability. Thus, the CAC-OS is suitably used as a constituent material of a variety of semiconductor devices.

<Stacked-Layer Structure 1>

Next, a stacked-layer structure of the imaging device will be described using a cross-sectional view. Note that components such as insulating layers and conductive layers that are described below are examples, and the imaging device may also include another component. Alternatively, some of the components described below may be omitted. The stacked-layer structure described below can be formed using a bonding step, a polishing step, and the like as needed.

Figure 18:
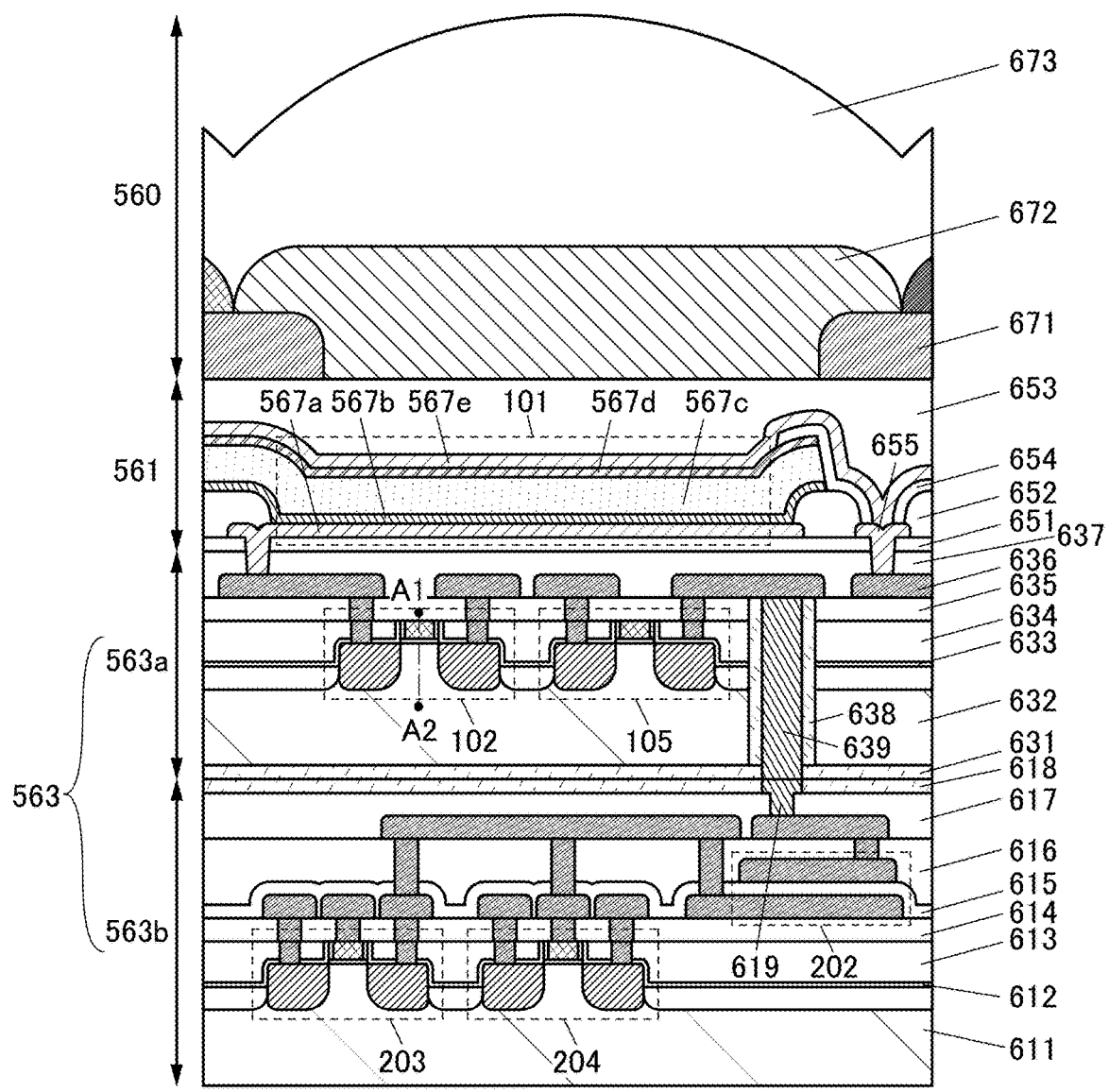
FIG. 18 is a cross-sectional view illustrating a pixel.

FIG. 18 shows an example of a cross-sectional view of a stack that includes a layer 560, the layer 561, and the layer 563 and has a bonding plane between the layer 563a and the layer 563b included in the layer 563.

<Layer 563b>

The layer 563b includes a functional circuit provided on a silicon substrate 611. Here, the capacitor 202, the transistor 203, and the transistor 204, which are included in the circuit 201, are shown as part of the functional circuit. One electrode of the capacitor 202, one of the source and the drain of the transistor 203, and the gate of the transistor 204 are electrically connected to each other.

In the layer 563b, the silicon substrate 611, insulating layers 612, 613, 614, 615, 616, 617, and 618, and a conductive layer 619 are provided. The insulating layer 612 has a function of a protective film. The insulating layers 613, 614, 616, and 617 each have functions of an interlayer insulating film and a planarization film. The insulating layer 615 has a function of a dielectric layer of the capacitor 202. The insulating layer 618 and the conductive layer 619 each have a function of a bonding layer. The conductive layer 619 is electrically connected to the one electrode of the capacitor 202.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layer will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the pixel 100. Here, the transistor 102 and the transistor 105 are shown as some of the components of the pixel 100. The cross-sectional view in FIG. 18 does not illustrate electrical connection between these transistors.

In the layer 563a, a silicon substrate 632 and insulating layers 631, 633, 634, 635, 637, and 638 are provided. Conductive layers 636 and 639 are also provided.

The insulating layer 631 and the conductive layer 639 each have a function of a bonding layer. The insulating layers 634, 635, and 637 each have functions of an interlayer insulating film and a planarization film. The insulating layer 633 has a function of a protective film. The insulating layer 638 has a function of insulating the silicon substrate 632 from the conductive layer 639. The insulating layer 638 can be formed using a material similar to that for another insulating layer. The insulating layer 638 may be formed using the same material as the insulating layer 631.

The conductive layer 639 is electrically connected to the other of the source and the drain of the transistor 105 and the conductive layer 619. The conductive layer 636 is electrically connected to the wiring 114 (see FIG. 3A).

Figure 19A:
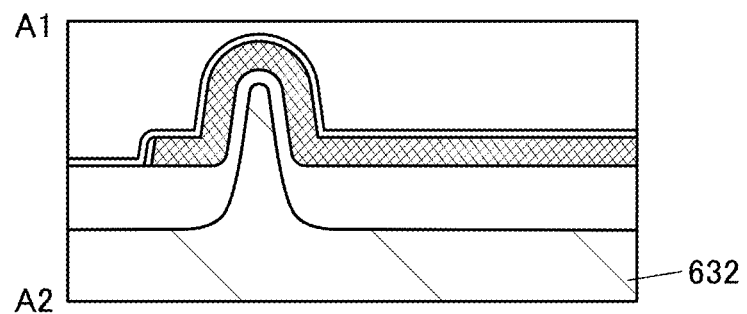
FIG. 19A to FIG. 19C are diagrams illustrating Si transistors.
Figure 19B:
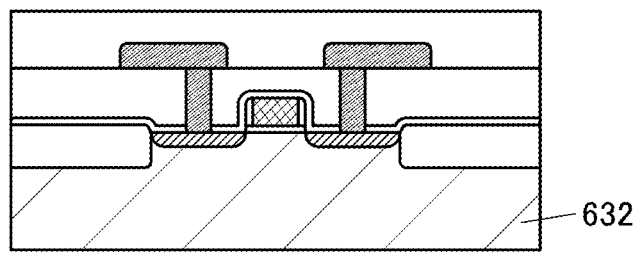

The Si transistors illustrated in FIG. 18 have a Fin-type structure including a channel formation region in a silicon substrate (the silicon substrate 611 or 632). FIG. 19A shows a cross section in the channel width direction (a cross section along A1-A2 in the layer 563a in FIG. 18). Note that the Si transistors may have a planar-type structure as illustrated in FIG. 19B.

Figure 19C:
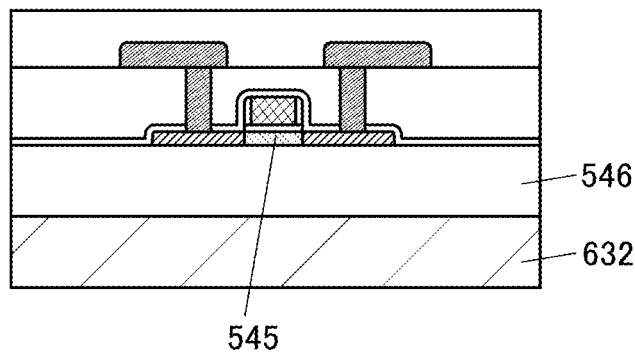

Alternatively, as illustrated in FIG. 19C, a transistor including a semiconductor layer 545 of a silicon thin film may be used. The semiconductor layer 545 can be single crystal silicon (SOI (Silicon on Insulator)) formed on an insulating layer 546 on the silicon substrate 632, for example.

<Layer 561>

The layer 561 includes the photoelectric conversion device 101. The photoelectric conversion device 101 can be formed over the layer 563a. FIG. 18 shows that the photoelectric conversion device 101 uses the organic optical conductive film illustrated in FIG. 17C as the photoelectric conversion layer. Here, the layer 567a is the cathode and the layer 567e is the anode.

In the layer 561, insulating layers 651, 652, 653, and 654 and a conductive layer 655 are provided.

The insulating layers 651, 653, and 654 each have functions of an interlayer insulating film and a planarization film. The insulating layer 654 is provided to cover an end portion of the photoelectric conversion device 101, and also has a function of preventing a short circuit between the layer 567e and the layer 567a. The insulating layer 652 has a function of an element isolation layer. As the element isolation layer, an organic insulating film or the like is preferably used.

The layer 567a corresponding to the cathode of the photoelectric conversion device 101 is electrically connected to one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film having a function of an anti-reflection film may be stacked.

As the optical conversion layer 672, a color filter can be used. When colors of (red), G (green), B (blue), Y (yellow), C (cyan), M (magenta), and the like are assigned to the color filters of respective pixels, a color image can be obtained.

When a wavelength cut filter is used as the optical conversion layer 672, the imaging device can capture images in various wavelength regions For example, when a filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When a filter that blocks light having a wavelength longer than or equal to that of visible light is used as the optical conversion layer 672, an ultraviolet imaging device can be obtained.

When a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, it is possible to use a resin or ceramics in which $Gd_2O_2S:Tb$, $Gd_2O_2S:Pr$, $Gd_2O_2S:Eu$, $BaFCl:Eu$, NaI, CsI, $CaF_2$, $BaF_2$, $CeF_3$, LiF, LiI, ZnO, or the like is dispersed.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like with a high visible-light transmitting property.

<Bonding>

Next, bonding of the layer 563b and the layer 563a will be described.

The insulating layer 618 and the conductive layer 619 are provided in the layer 563b. The conductive layer 619 includes a region embedded in the insulating layer 618. The surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. The surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, or Au can be used, for example. Preferably, Cu, Al, W, or Au is used for easy bonding. For the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding where the boundary between the layer 563b and the layer 563a is a bonding position can be performed.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the bonding, the electrical connection between the conductive layer 619 and the conductive layer 639 can be obtained. Moreover, the connection between the insulating layer 618 and conductive layer 631 with mechanical strength can be obtained.

To bond metal layers to each other, it is possible to use a surface activated bonding method in which the cleaned and activated surfaces obtained by removing an oxide film, a layer adsorbing impurities, and the like on the surfaces by sputtering or the like are brought into contact to be bonded to each other. Alternatively, it is possible to use, for example, a diffusion bonding method in which the surfaces are bonded to each other by using temperature and pressure together. Both methods cause bonding at an atomic level, and therefore mechanically as well as electrically excellent bonding can be obtained.

To bond insulating layers to each other, it is possible to use, for example, a hydrophilic bonding method in which after high planarity of the insulating layers is obtained by polishing or the like, the surfaces of the insulating layers are subjected to hydrophilicity treatment with oxygen plasma or the like, arranged in contact with and bonded to each other temporarily, and then dehydrated by heat treatment to perform final bonding. The hydrophilic bonding method also causes bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the circuit 201 included in the layer 563b and the components of the pixel 100 included in the layer 563a to be electrically connected to each other.

<Variation Example of Stacked-Layer Structure 1>

Figure 20:
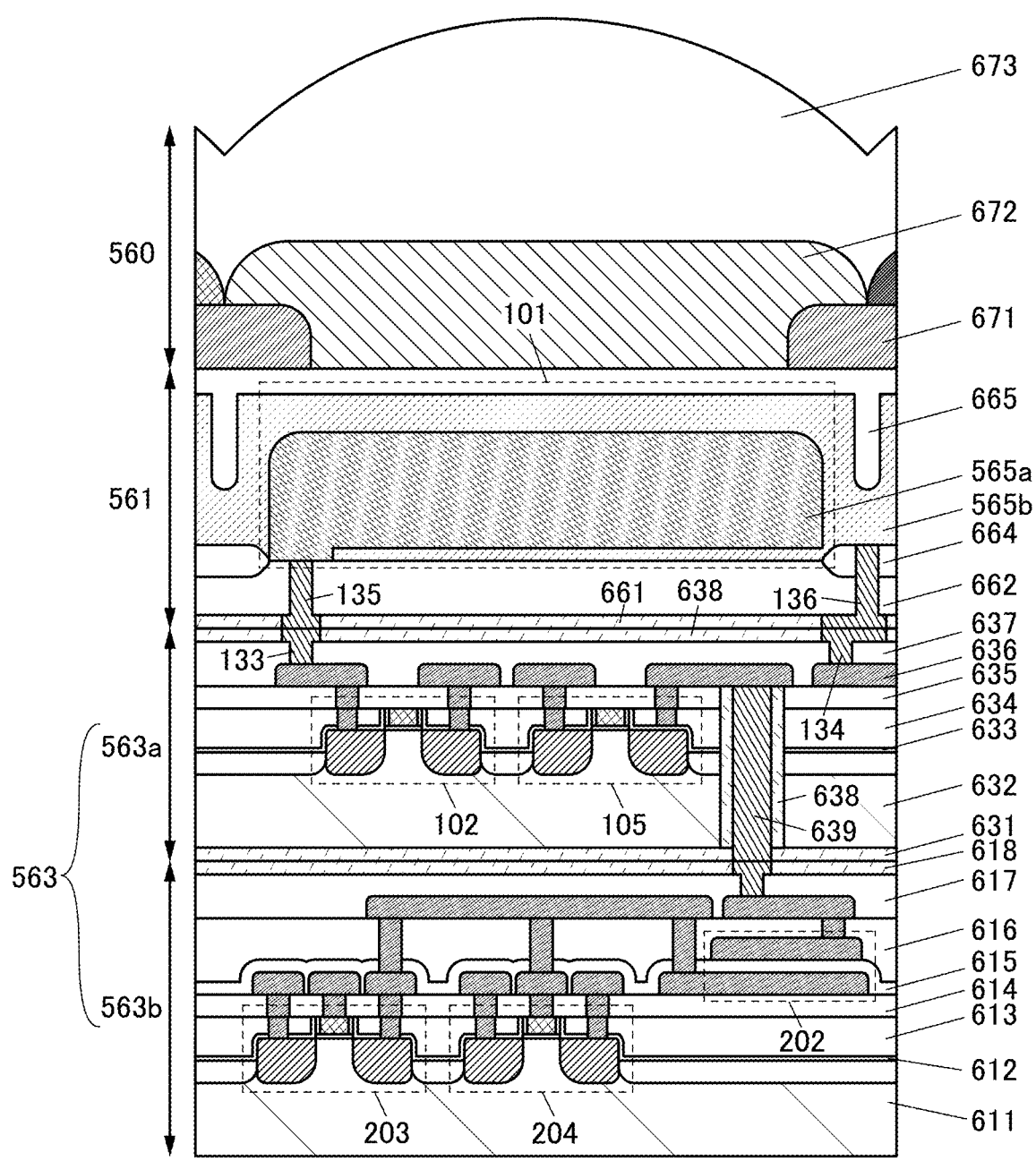
FIG. 20 is a cross-sectional view illustrating a pixel.

FIG. 20 shows a variation example of the stacked-layer structure illustrated in FIG. 18. In the structure in FIG. 20, the structure of the photoelectric conversion device 101 included in the layer 561 and part of the structure of the layer 563a are different from those in FIG. 18, and a bonding plane is also included between the layer 561 and the layer 563a.

The layer 561 includes the photoelectric conversion device 101, insulating layers 661, 662, 664, and 665, and conductive layers 135 and 136.

The photoelectric conversion device 101 is a pn-junction photodiode formed on a silicon substrate, and includes the layer 565b corresponding to a p-type region and the layer 565a corresponding to an n-type region. The photoelectric conversion device 101 is a pinned photodiode, which can suppress dark current and reduce noise with a thin p-type region (part of the layer 565b) provided on the surface side (current extraction side) of the layer 565a.

The insulating layer 661 and the conductive layers 135 and 136 each have a function of a bonding layer. The insulating layer 662 has functions of an interlayer insulating film and a planarization film. The insulating layer 664 has a function of an element isolation layer. The insulating layer 665 has a function of suppressing carrier leakage.

The silicon substrate is provided with a groove that separates pixels, and the insulating layer 665 is provided on the top surface of the silicon substrate and in the groove. Providing the insulating layer 665 can suppress leakage of carriers generated in the photoelectric conversion device 101 to an adjacent pixel. The insulating layer 665 also has a function of suppressing entry of stray light. Thus, color mixture can be suppressed with the insulating layer 665. Note that an anti-reflection film may be provided between the top surface of the silicon substrate and the insulating layer 665.

The element isolation layer can be formed by a LOCOS (LOCal Oxidation of Silicon) method. Alternatively, the element isolation layer may be formed by an STI (Shallow Trench Isolation) method or the like. As the insulating layer 665, for example, an inorganic insulating film of silicon oxide, silicon nitride, or the like or an organic insulating film of polyimide, acrylic, or the like can be used. The insulating layer 665 may have a multilayer structure.

The layer 565a (corresponding to the n-type region and the cathode) of the photoelectric conversion device 101 is electrically connected to the conductive layer 135. The layer 565b (corresponding to the p-type region and the anode) is electrically connected to the conductive layer 136. The conductive layers 135 and 136 each include a region embedded in the insulating layer 661. The surfaces of the insulating layer 661 and the conductive layers 135 and 136 are planarized to be level with each other.

In the layer 563a, the insulating layer 638 is formed over the insulating layer 637. Moreover, a conductive layer 133 electrically connected to one of the source and the drain of the transistor 102 and a conductive layer 134 electrically connected to the conductive layer 636 are formed.

The insulating layer 638 and the conductive layers 133 and 134 each have a function of a bonding layer. The conductive layers 133 and 134 each include a region embedded in the insulating layer 638. The surfaces of the insulating layer 638 and the conductive layers 133 and 134 are planarized to be level with each other.

Here, the conductive layers 133, 134, 135, and 136 are bonding layers like the above-described conductive layers 619 and 639. The insulating layers 638 and 661 are bonding layers like the above-described insulating layers 618 and 631.

Thus, when the conductive layer 133 and the conductive layer 135 are bonded to each other, the layer 565a (corresponding to the n-type region and the cathode) of the photoelectric conversion device can be electrically connected to the one of the source and the drain of the transistor 102. When the conductive layer 134 and the conductive layer 136 are bonded to each other, the layer 565b (corresponding to the p-type region and the anode) of the photoelectric conversion device can be electrically connected to the wiring 114 (see FIG. 3A). When the insulating layer 638 and the insulating layer 661 are bonded to each other, electrical bonding and mechanical bonding of the layer 561 and the layer 563a can be performed.

<Stacked-Layer Structure 2>

Figure 21:
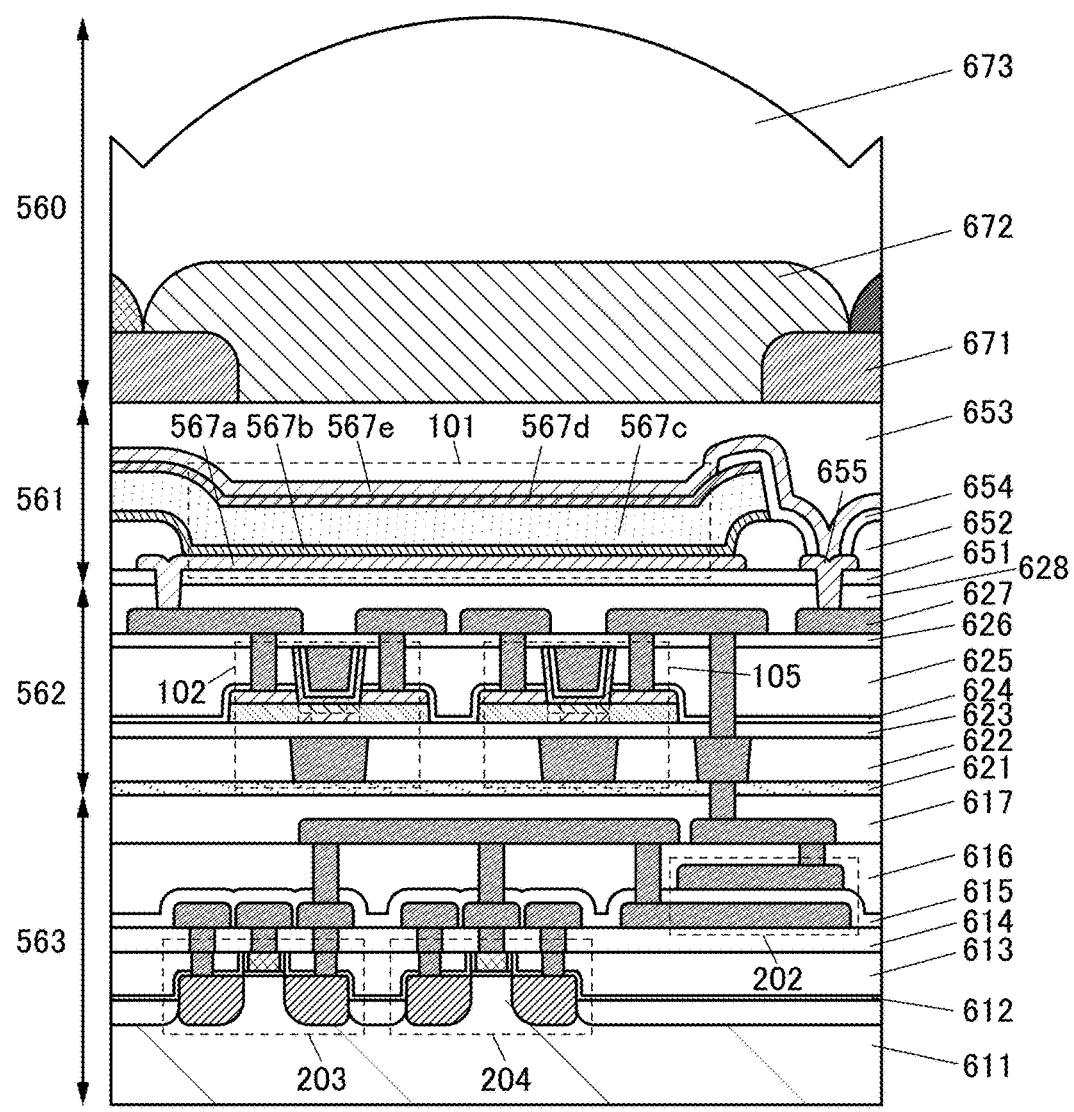
FIG. 21 is a cross-sectional view illustrating a pixel.

FIG. 21 shows an example of a cross-sectional view of a stack that includes the layers 560, 561, 562, and 563 and has no bonding plane. Si transistors are provided in the layer 563. OS transistors are provided in the layer 562. Note that the structures of the layer 563, the layer 561, and the layer 560 are the same as those illustrated in FIG. 18; therefore, the description thereof is omitted here.

<Layer 562>

The layer 562 is formed over the layer 563. The layer 562 includes OS transistors. Here, the transistor 102 and the transistor 105 are shown as some of the components of the pixel 100. The cross-sectional view in FIG. 21 does not illustrate electrical connection between these transistors.

In the layer 562, insulating layers 621, 622, 623, 624, 625, 626, and 628 are provided. Moreover, a conductive layer 627 is provided. The conductive layer 627 can be electrically connected to the wiring 114 (see FIG. 3A).

The insulating layer 621 has a function of a blocking layer. The insulating layers 622, 623, 625, 626, and 628 each have functions of an interlayer insulating film and a planarization film. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one of factors of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The other of the source and the drain of the transistor 105 is electrically connected to one electrode of the capacitor 202 through a plug. The conductive layer 627 is electrically connected to the wiring 114 (see FIG. 3A).

One of the source and the drain of the transistor 102 is electrically connected to the cathode of the photoelectric conversion device 101 included in the layer 561. The conductive layer 627 is electrically connected to the anode of the photoelectric conversion device 101 included in the layer 561.

Figure 22A:
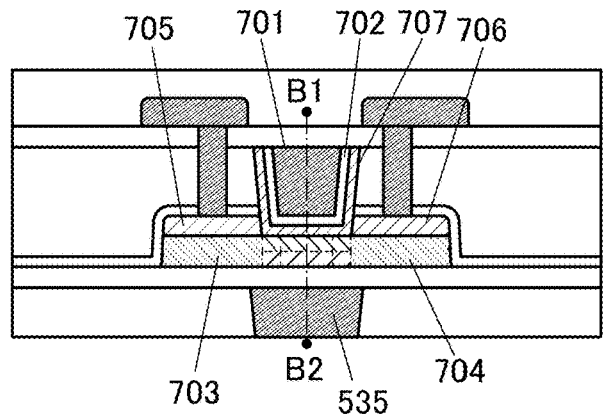
FIG. 22A to FIG. 22D are diagrams illustrating OS transistors.

The details of an OS transistor are illustrated in FIG. 22A. The OS transistor illustrated in FIG. 22A has a self-aligned structure in which a source electrode 705 and a drain electrode 706 are formed through formation of an insulating layer over a stack of an oxide semiconductor layer and a conductive layer and formation of an opening portion reaching the oxide semiconductor layer.

The OS transistor can include a gate electrode 701 and a gate insulating film 702 in addition to a channel formation region, a source region 703, and a drain region 704 that are formed in the oxide semiconductor layer. At least the gate insulating film 702 and the gate electrode 701 are provided in the opening portion. An oxide semiconductor layer 707 may also be provided in the opening portion.

Figure 22B:
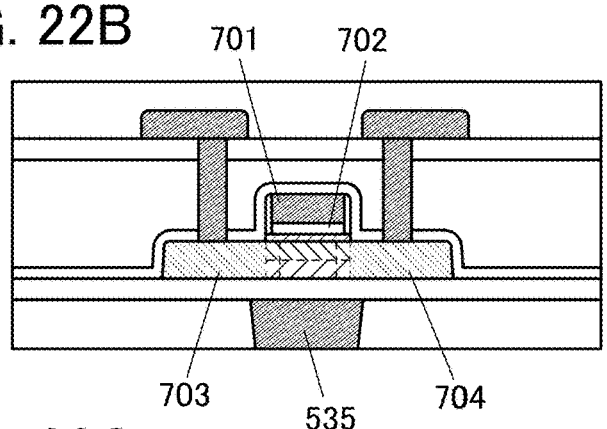

As illustrated in FIG. 22B, the OS transistor may have a self-aligned structure in which the source region 703 and the drain region 704 are formed in the semiconductor layer with the gate electrode 701 as a mask.

Figure 22C:
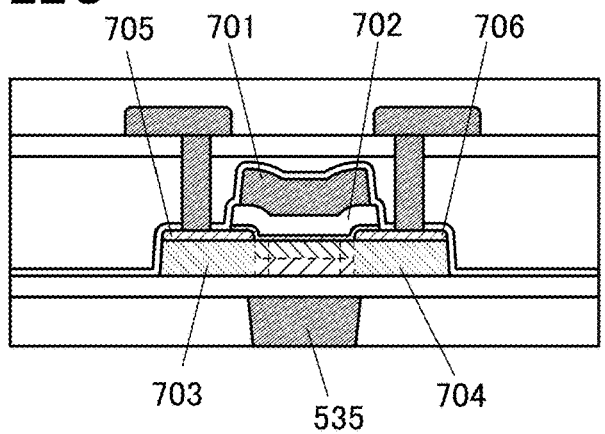

As illustrated in FIG. 22C, the OS transistor may be a non-self-aligned top-gate transistor including a region where the gate electrode 701 overlaps the source electrode 705 or the drain electrode 706.

Figure 22D:
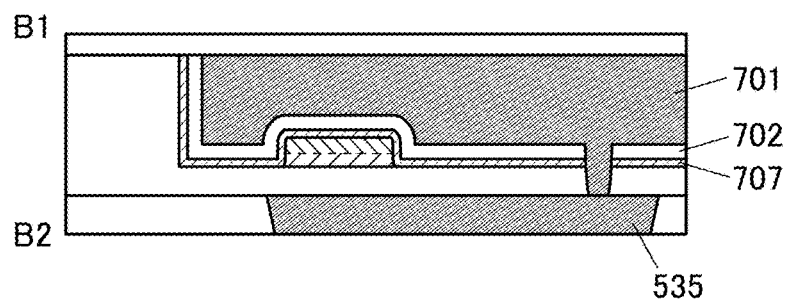

Although the OS transistor has a structure with a back gate 535, it may have a structure without a back gate. As illustrated in a cross-sectional view of the transistor in the channel width direction in FIG. 22D, the back gate 535 may be electrically connected to a front gate of the transistor, which is provided to face the back gate. Note that FIG. 22D illustrates a B1-B2 cross section of the transistor in FIG. 22A as an example, and the same applies to a transistor having any of the other structures. A structure may be employed in which different fixed potentials can be supplied to the back gate 535 and the front gate.

<Variation Example of Stacked-Layer Structure 2>

Figure 23:
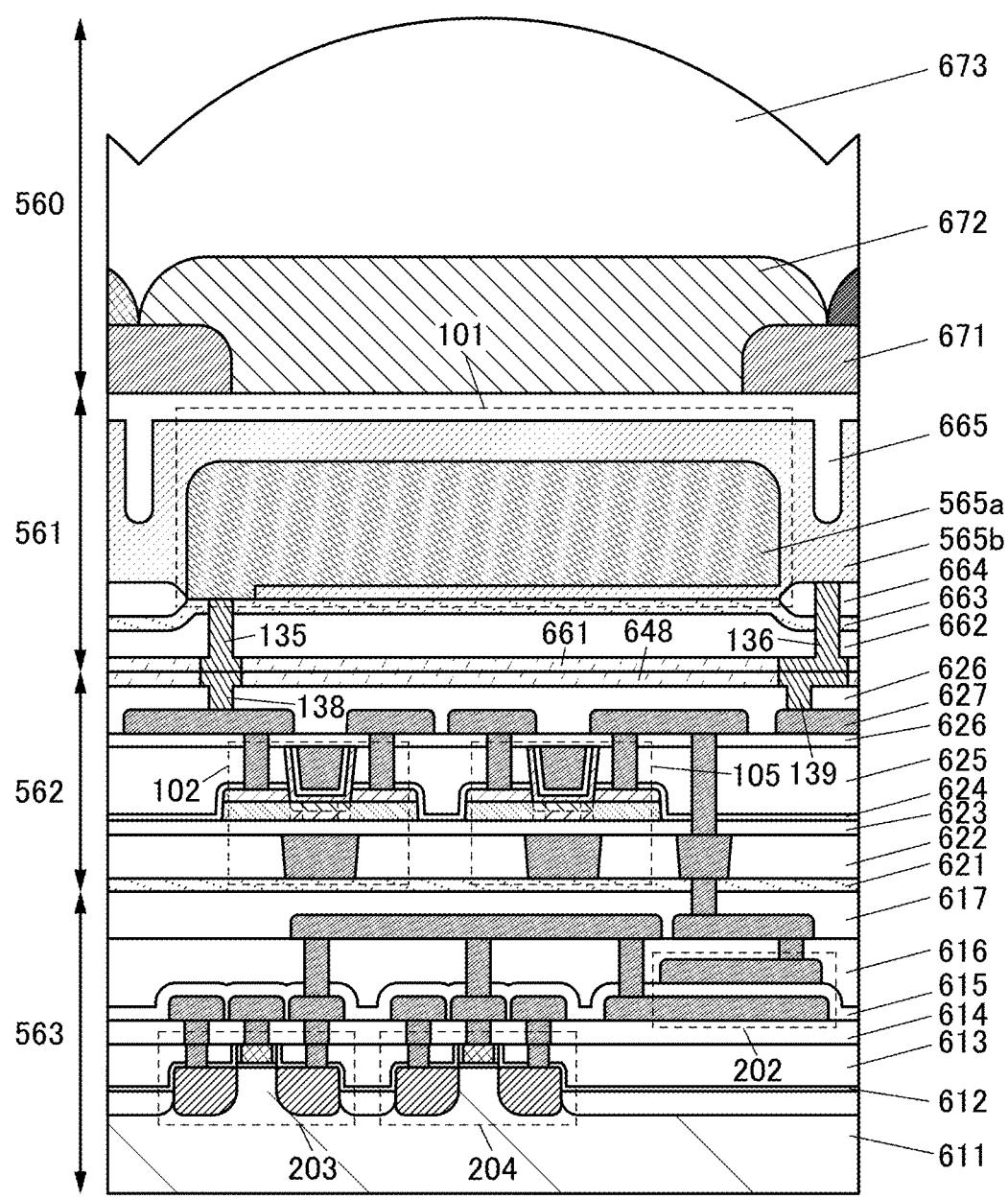
FIG. 23 is a cross-sectional view illustrating a pixel.

FIG. 23 shows a variation example of the stacked-layer structure illustrated in FIG. 21. In the structure in FIG. 23, the structure of the photoelectric conversion device 101 included in the layer 561 and part of the structure of the layer 562 are different from those in FIG. 21, and a bonding plane is included between the layer 561 and the layer 562.

The photoelectric conversion device 101 included in the layer 561 is a pn-junction photodiode formed on a silicon substrate, and has the same structure as that illustrated in FIG. 20. The insulating layer 663 has a function of a blocking layer like the insulating layer 621.

In the layer 562, an insulating layer 648 is formed over the insulating layer 628. Moreover, a conductive layer 138 electrically connected to one of the source and the drain of the transistor 102 and a conductive layer 139 electrically connected to the conductive layer 627 are formed.

The insulating layer 648 and the conductive layers 138 and 139 each have a function of a bonding layer. The conductive layers 138 and 139 each include a region embedded in the insulating layer 648. The surfaces of the insulating layer 648 and the conductive layers 138 and 139 are planarized to be level with each other.

Here, the conductive layers 138 and 139 are bonding layers like the above-described conductive layers 619 and 639. The insulating layer 648 is a bonding layer like the above-described insulating layers 618 and 631.

Thus, when the conductive layer 138 and the conductive layer 135 are bonded to each other, the layer 565a (corresponding to the n-type region and the cathode) of the photoelectric conversion device can be electrically connected to the one of the source and the drain of the transistor 102. When the conductive layer 139 and the conductive layer 136 are bonded to each other, the layer 565b (corresponding to the p-type region and the anode) of the photoelectric conversion device can be electrically connected to the wiring 114 (see FIG. 3A). When the insulating layer 648 and the insulating layer 661 are bonded to each other, electrical bonding and mechanical bonding of the layer 561 and the layer 562 can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a silicon substrate on which a device is formed, and thus a bonding step can be skipped.

<Package and Module>

FIG. 24A1 is an external perspective view of the top surface side of a package in which an image sensor chip is placed. The package includes a package substrate 410 to which an image sensor chip 450 (see FIG. 24A3) is fixed, a cover glass 420, an adhesive 430 for bonding them, and the like.

FIG. 24A2 is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

FIG. 24A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 24B1 is an external perspective view of the top surface side of a camera module in which an image sensor chip is placed in a package with a built-in lens. The camera module includes a package substrate 411 to which an image sensor chip 451 (see FIG. 24B3) is fixed, a lens cover 421, a lens 435, and the like. An IC chip 490 (see FIG. 24B3) having functions of a driver circuit, a signal conversion circuit, and the like of an imaging device is provided between the package substrate 411 and the image sensor chip 451; thus, the structure as an SiP (System in package) is included.

FIG. 24B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 24B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed circuit board and the like; hence, the image sensor chip can be incorporated into a variety of semiconductor devices and electronic devices.

This embodiment can be combined with the description of the other embodiments as appropriate.

Embodiment 3

Examples of electronic devices that can include the imaging device of one embodiment of the present invention include display devices, personal computers, image memory devices and image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), and vending machines. FIG. 25A to FIG. 25F show specific examples of such electronic devices.

Figure 25A:
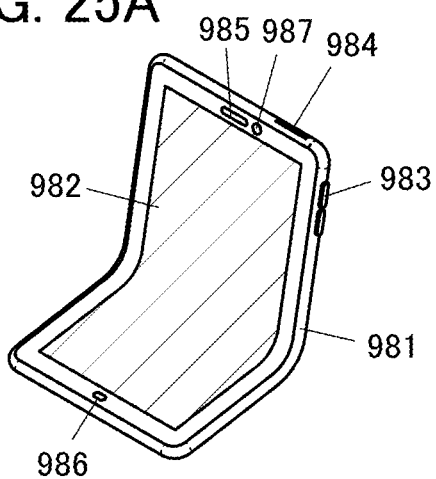
FIG. 25A to FIG. 25F are diagrams illustrating electronic devices.

FIG. 25A shows an example of a mobile phone that includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used in the mobile phone.

Figure 25B:
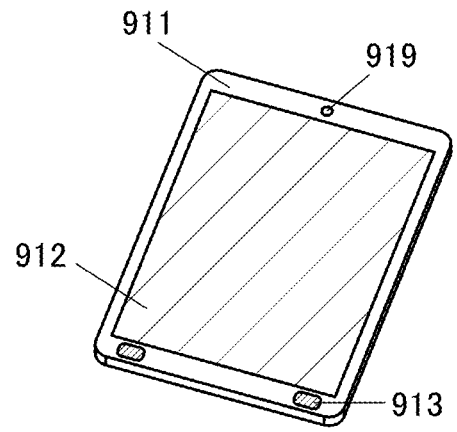

FIG. 25B shows a portable data terminal that includes a housing 911, a display portion 912, a speaker 913, a camera 919, and the like. A touch panel function of the display portion 912 enables input and output of information. Furthermore, text or the like can be recognized in an image captured by the camera 919, and the text can be output as voice from the speaker 913. The imaging device of one embodiment of the present invention and the operation method thereof can be used in the portable data terminal.

Figure 25C:
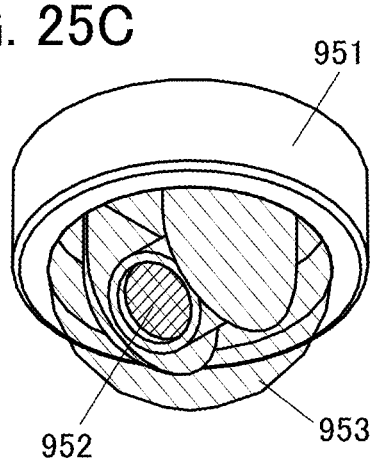

FIG. 25C shows a surveillance camera that includes a support base 951, a camera unit 952, a protection cover 953, and the like. The camera unit 952 is provided with a rotation mechanism and the like and can capture an image of all of the surroundings when provided on a ceiling. The imaging device of one embodiment of the present invention and the operation method thereof can be used to obtain an image in the camera unit. Note that a surveillance camera is a name in common use and does not limit the application thereof. A device that has a function of a surveillance camera can also be called a camera or a video camera, for example.

Figure 25D:
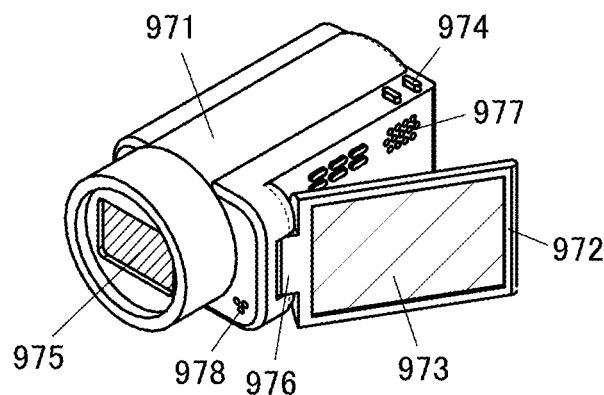

FIG. 25D shows a video camera that includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera.

Figure 25E:
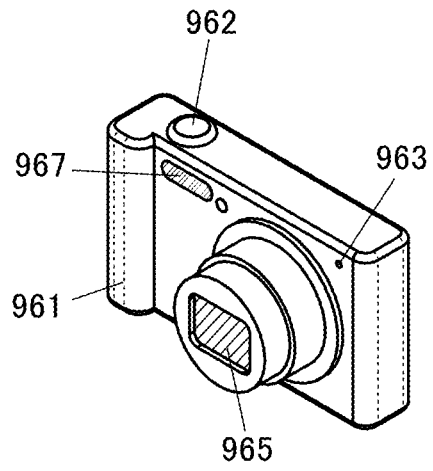

FIG. 25E shows a digital camera that includes a housing 961, a shutter button 962, a microphone 963, a light-emitting portion 967, a lens 965, and the like. The imaging device of one embodiment of the present invention and the operation method thereof can be used in the digital camera.

Figure 25F:
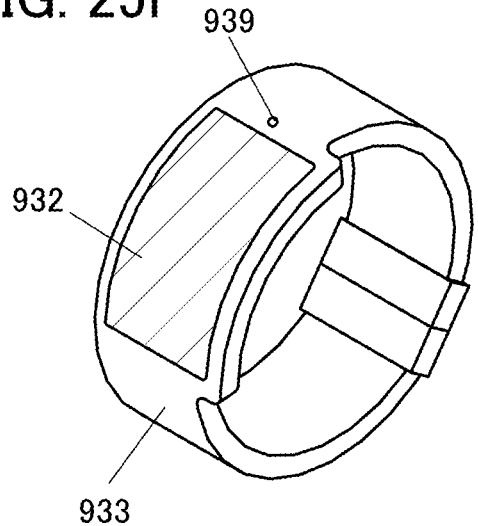

FIG. 25F shows a wrist-watch-type information terminal that includes a display portion 932, a housing and wristband 933, a camera 939, and the like. The display portion 932 is provided with a touch panel for operating the information terminal. The display portion 932 and the housing and wristband 933 have flexibility and fit a body well. The imaging device of one embodiment of the present invention and the operation method thereof can be used in the information terminal.

This embodiment can be combined with the description of the other embodiments as appropriate.

REFERENCE NUMERALS

100: pixel, 101: photoelectric conversion device, 102: transistor, 103: transistor, 104: transistor, 105: transistor, 106: transistor, 107: transistor, 108: capacitor, 111: wiring, 112: wiring, 114: wiring, 115: wiring, 116: wiring, 121: wiring, 122: wiring, 123: wiring, 124: wiring, 125: wiring, 133: conductive layer, 134: conductive layer, 135: conductive layer, 136: conductive layer, 138: conductive layer, 139: conductive layer, 161: transistor, 162: transistor, 163: capacitor, 170: circuit, 200: pixel block, 201: circuit, 202: capacitor, 203: transistor, 204: transistor, 205: transistor, 206: transistor, 207: transistor, 211: wiring, 212: wiring, 213: wiring, 215: wiring, 216: wiring, 217: wiring, 218: wiring, 219: wiring, 300: imaging device, 301: circuit, 302: circuit, 303: circuit, 304: circuit, 305: circuit, 306: display device, 310: pixel array, 311: circuit, 312: circuit, 313: circuit, 315: wiring, 320: memory cell, 325: reference memory cell, 330: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 545: semiconductor layer, 546: insulating layer, 560: layer, 561: layer, 562: layer, 562a: layer, 562b: layer, 563: layer, 563a: layer, 563b: layer, 563c: layer, 565a: layer, 565b: layer, 566a: layer, 566b: layer, 566c: layer, 566d: layer, 567a: layer, 567b: layer, 567c: layer, 567d: layer, 567e: layer, 611: silicon substrate, 612: insulating layer, 613: insulating layer, 614: insulating layer, 615: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 663: insulating layer, 664: insulating layer, 665: insulating layer, 671: light-blocking layer, 672: optical conversion layer, 673: microlens array, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:
1. An imaging system comprising:
an imaging device, a first semiconductor device, a second semiconductor device, and a third semiconductor device,
wherein the imaging device is configured to obtain first data and second data in each frame period, wherein the imaging device is configured to generate third data by filter processing of the first data and generate fourth data by filter processing of the second data, wherein the first semiconductor device is configured to generate fifth data by arithmetic operation using third data and fourth data that are obtained in an n-th frame, where n is a natural number, wherein the first semiconductor device is configured to generate sixth data by arithmetic operation using third data and fourth data that are obtained in an (n+1)th frame, wherein the second semiconductor device is configured to generate an interpolation image by using the fifth data and the sixth data, and wherein the third semiconductor device is configured to generate moving image data including first data obtained in the n-th frame, the interpolation image, and first data obtained in the (n+1)th frame in this order.

2. The imaging system according to claim 1, wherein the third data is generated while the second data is obtained.

3. An electronic device comprising:
the imaging system according to claim 1; and
a display device.

4. An imaging system comprising:
an imaging device, a first semiconductor device, a second semiconductor device, and a third semiconductor device, wherein the imaging device is configured to obtain first data and second data, wherein the first image is obtained in each frame period, wherein the imaging device is configured to generate third data by filter processing of the first data and generate fourth data by filter processing of the second data, wherein the first semiconductor device is configured to generate fifth data by arithmetic operation using third data and fourth data that are obtained in an n-th frame, where n is a natural number, wherein the first semiconductor device is configured to generate sixth data by arithmetic operation using third data and fourth data that are obtained in an (n+1)th frame, wherein the second semiconductor device is configured to generate an interpolation image by using the fifth data and the sixth data, and wherein the third semiconductor device is configured to generate moving image data including first data obtained in the n-th frame, the interpolation image, and first data obtained in the (n+1)th frame in this order.

5. The imaging system according to claim 4, wherein filter processing of the first data obtained in the n-th frame is performed in the (n+1)th frame.

6. The imaging system according to claim 4,
wherein the imaging device comprises a pixel block, a first circuit, and a second circuit, wherein the pixel block comprises a plurality of pixels, wherein the first circuit is configured to supply a first potential or a second potential to each of the pixels, wherein each of the pixels is configured to obtain the first data, wherein each of the pixels is configured to generate the second data by adding the first potential to the first data, wherein each of the pixels is configured to generate the third data by adding the second potential to the first data, and wherein the second circuit is configured to generate the fourth data corresponding to a difference between a sum of the second data output from the plurality of pixels and a sum of the third data output from the plurality of pixels.

7. The imaging system according to claim 6,
wherein each of the pixels comprises a first transistor, a second transistor, a third transistor, a fourth transistor, a fifth transistor, a sixth transistor, a photoelectric conversion device, and a capacitor, wherein one electrode of the photoelectric conversion device is electrically connected to one of a source and a drain of the first transistor and one of a source and a drain of the second transistor, and the other of the source and the drain of the first transistor is electrically connected to one of a source and a drain of the third transistor, a gate of the fourth transistor, and one electrode of the capacitor, wherein one of a source and a drain of the fourth transistor is electrically connected to one of a source and a drain of the fifth transistor, and wherein the other electrode of the capacitor is electrically connected to one of a source and a drain of the sixth transistor.

8. The imaging system according to claim 7,
wherein the first circuit is electrically connected to the other of the source and the drain of the sixth transistor.

9. The imaging system according to claim 7,
wherein the second circuit is configured to be a correlated double sampling circuit, and
wherein the second circuit is electrically connected to the other of the source and the drain of the fifth transistor.

10. The imaging system according to any one of claim 7,
wherein at least one of the first transistor to the sixth transistor comprises a metal oxide in a channel formation region, and the metal oxide comprises In, Zn, and M, where M is one or more of Al, Ti, Ga, Ge, Sn, Y, Zr, La, Ce, Nd, and Hf.

* * * * *